US011210018B2

(12) United States Patent
Kramolinski et al.

(10) Patent No.: US 11,210,018 B2
(45) Date of Patent: Dec. 28, 2021

(54) HOLISTIC LINKING OF DATA ACROSS DATA SOURCES

(71) Applicant: Honeywell International Inc., Morris Plains, NJ (US)

(72) Inventors: Miroslav Krasimirov Kramolinski, Sofia (BG); Ivan Valeriev Markov, Sofia (BG); Hristo Tihomirov Kyurkchiev, Sofia (BG)

(73) Assignee: Honeywell International Inc., Morris Plains, NJ (US)

( * ) Notice: Subject to any disclaimer, the term of this patent is extended or adjusted under 35 U.S.C. 154(b) by 32 days.

(21) Appl. No.: 16/878,070

(22) Filed: May 19, 2020

(65) Prior Publication Data
US 2020/0371707 A1 Nov. 26, 2020

Related U.S. Application Data

(60) Provisional application No. 62/850,374, filed on May 20, 2019.

(51) Int. Cl.
*G06F 3/06* (2006.01)
*G11C 11/4093* (2006.01)

(52) U.S. Cl.
CPC ............ *G06F 3/0656* (2013.01); *G06F 3/067* (2013.01); *G06F 3/0626* (2013.01); *G06F 3/0643* (2013.01); *G06F 3/0661* (2013.01); *G11C 11/4093* (2013.01)

(58) Field of Classification Search
CPC ...... G06F 3/0605; G06F 3/061; G06F 3/0626; G06F 3/0638; G06F 3/0643; G06F 3/0653; G06F 3/0656; G06F 3/0661; G06F 3/067; G11C 11/4093
USPC .......................... 707/726, 737; 711/154, 173
See application file for complete search history.

(56) References Cited

U.S. PATENT DOCUMENTS

| | | | | |
|---|---|---|---|---|
| 2013/0198680 | A1* | 8/2013 | Schwend | G06F 3/0481 715/781 |
| 2014/0344508 | A1* | 11/2014 | Khan | G06F 3/0644 711/103 |
| 2015/0154200 | A1* | 6/2015 | Lightner | G06F 16/13 707/693 |
| 2016/0313915 | A1* | 10/2016 | Oe | G06F 3/0685 |

* cited by examiner

*Primary Examiner* — Gary J Portka
(74) *Attorney, Agent, or Firm* — Alston & Bird LLP

(57) ABSTRACT

Method, apparatus and computer program product for linking data entries across data sources. For example, the apparatus includes at least one processor and at least one non-transitory memory including program code. The at least one non-transitory memory and the program code are configured to, with the at least one processor, store unlinked data entries in a staging memory area; store linked data entries in an active memory area; identifying a linked state status for the staging memory area, wherein the linked state status initially indicates a non-linked state; repeatedly performing one or more cross-data-source linking operations until the linked state status for the staging memory area indicates a linked state; and in response to determining that the linked state status for the staging memory area indicates the linked state, linking the multiple data entries by merging the staging memory area and the active memory area to generate linked data.

20 Claims, 15 Drawing Sheets

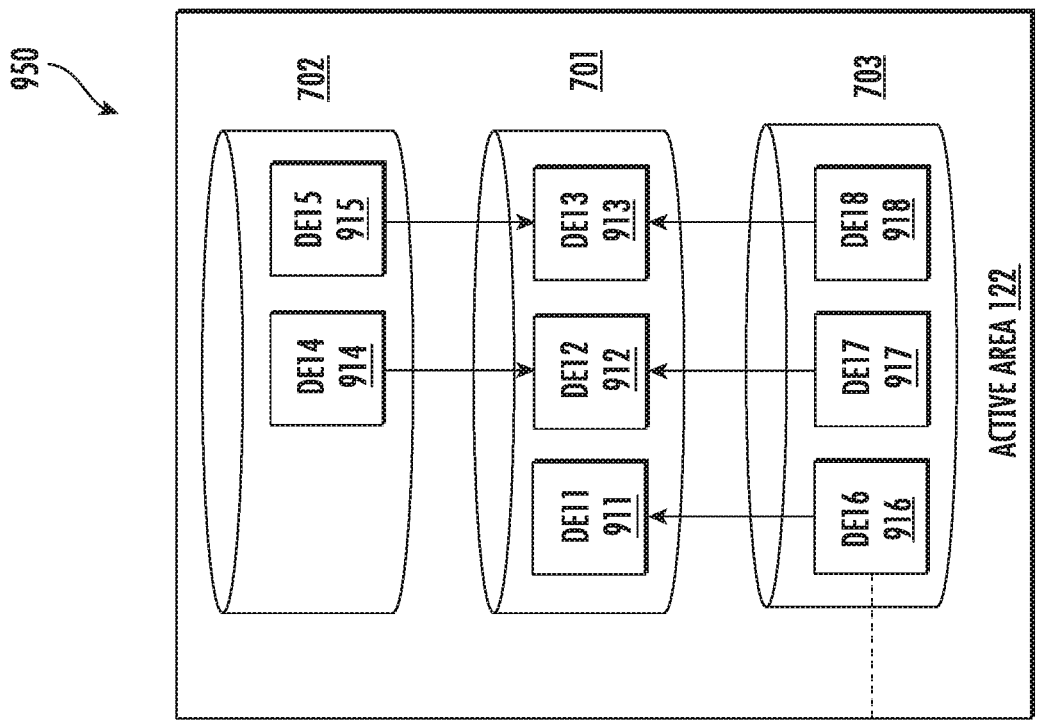
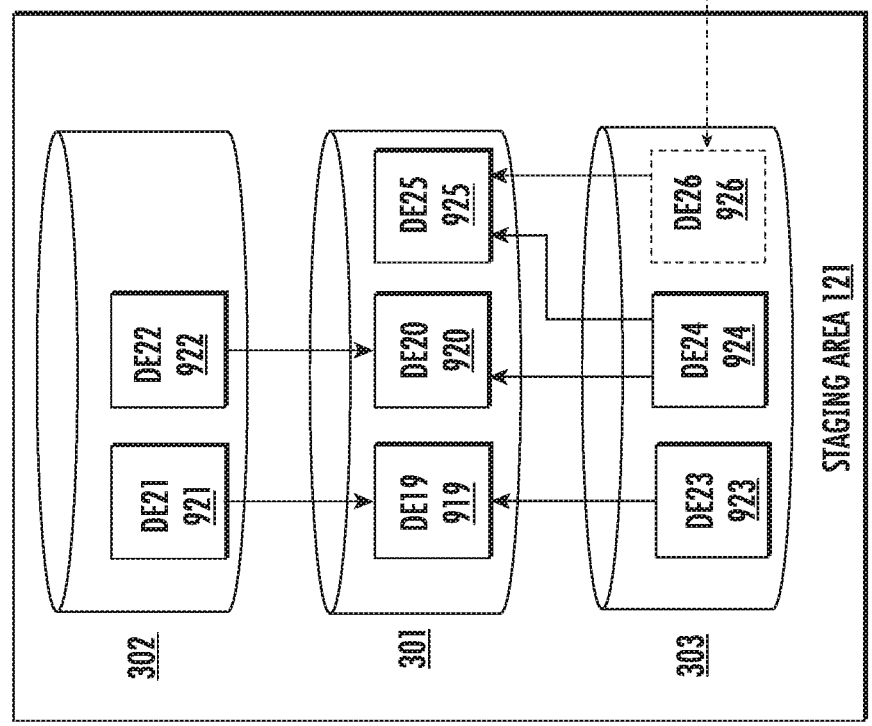
FIG. 9B

HOLISTIC LINKING OF DATA ACROSS DATA SOURCES

CROSS REFERENCE TO RELATED APPLICATIONS

This application is a conversion of provisional U.S. Patent Application No. 62/850,374, titled "Holistic Linking of Data Across Data Sources," filed May 20, 2019, which is incorporated by reference herein in its entirety.

BRIEF DESCRIPTION OF THE DRAWINGS

Figure 1:
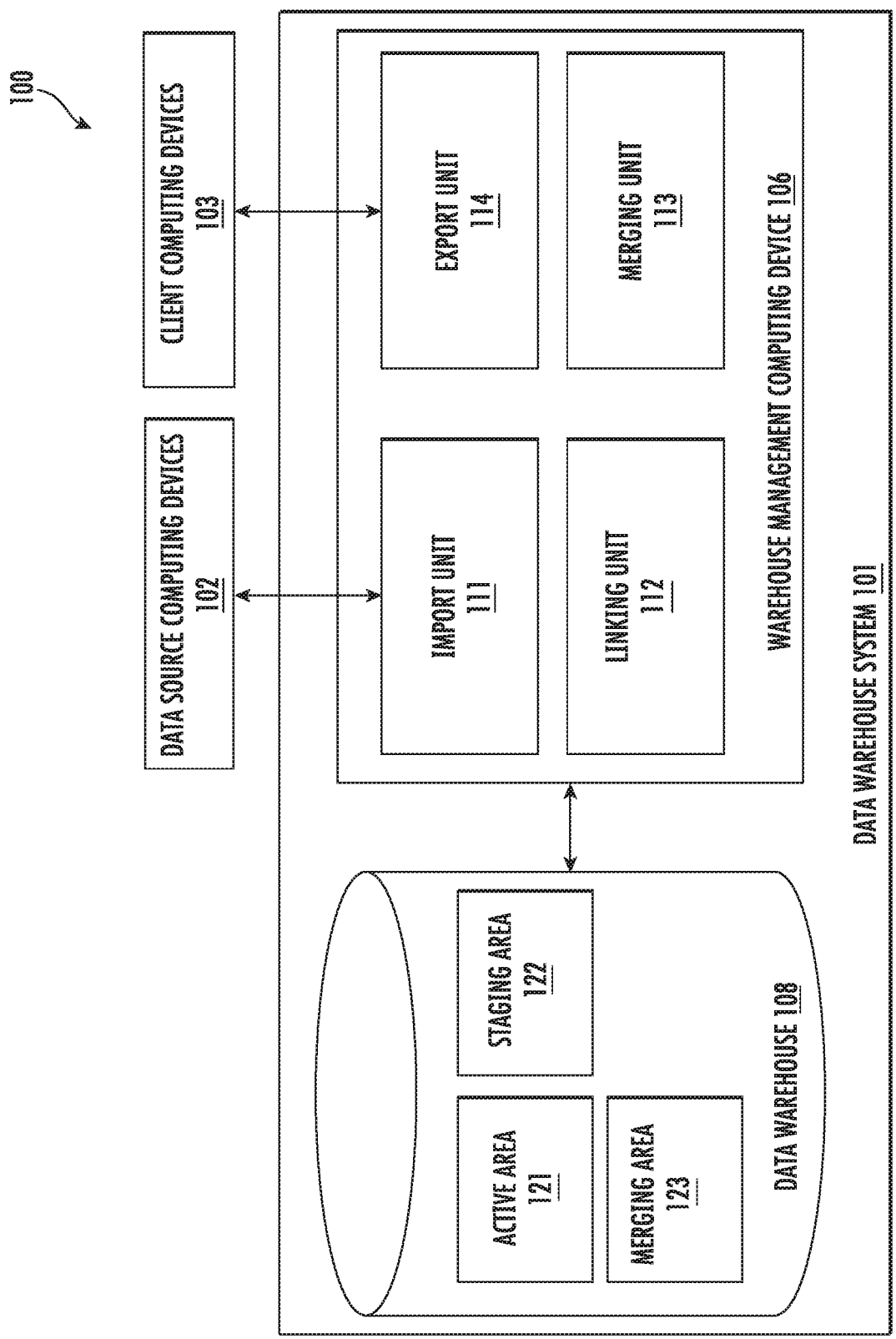

Having thus described some embodiments in general terms, references will now be made to the accompanying drawings, which are not necessarily drawn to scale, and wherein:

FIG. 1 is an example system architecture within which embodiments of the present disclosure may operate.

Figure 2:
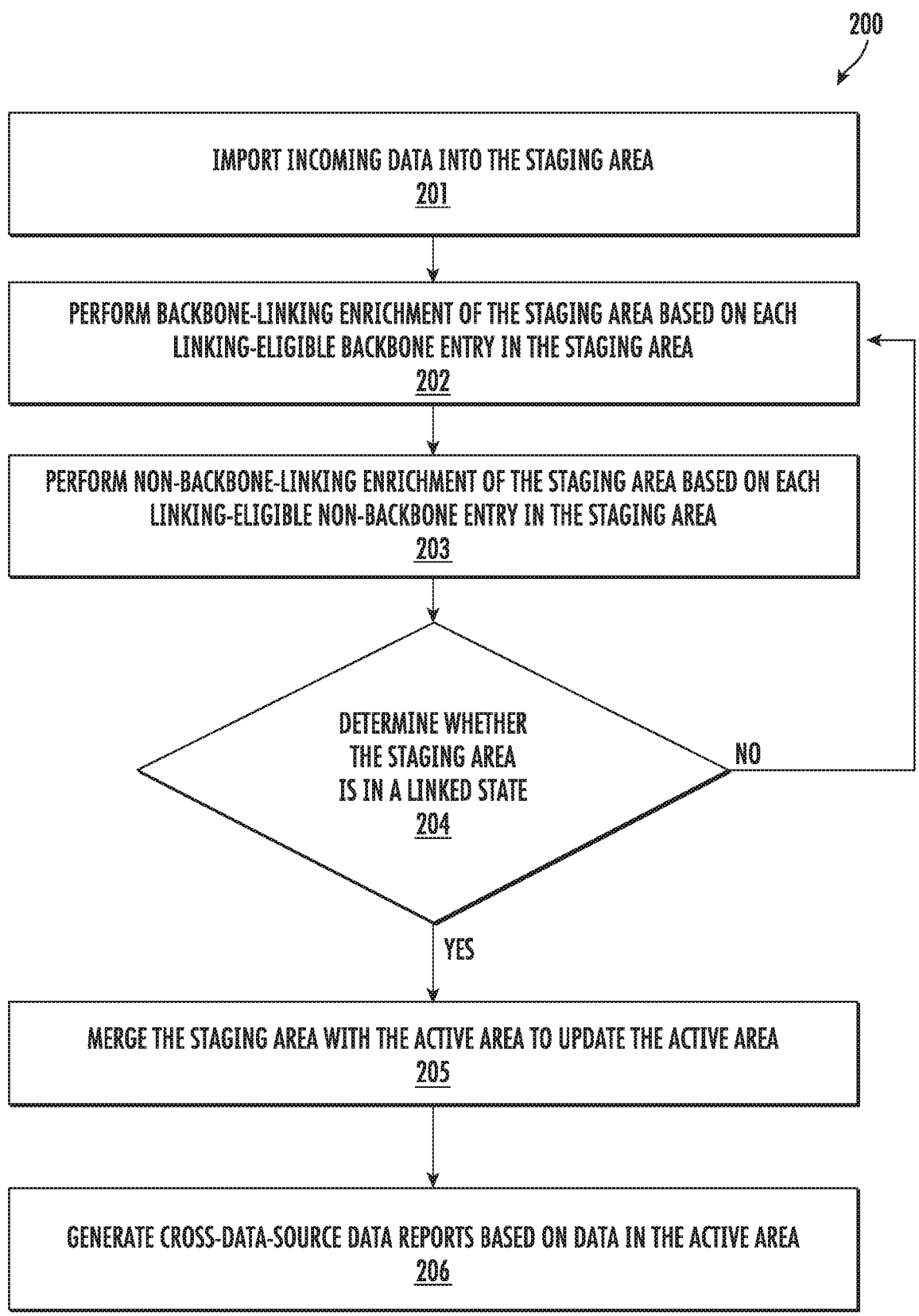

FIG. 2 is a flowchart diagram of an example process for generating cross-data-source data reports in accordance with one embodiment of the present disclosure.

Figure 3:
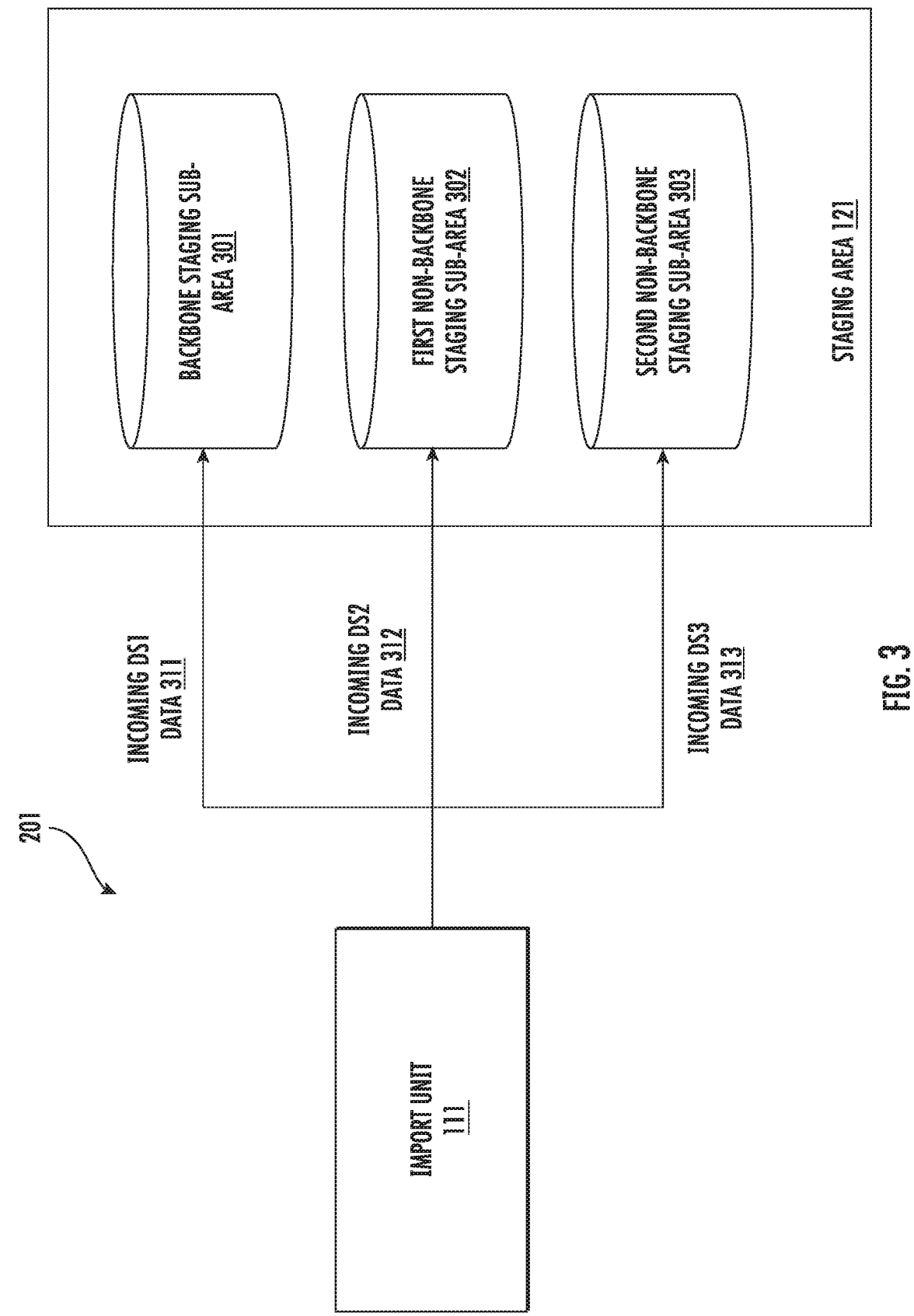

FIG. 3 is a data flow diagram of an example process for importing incoming data into a staging area in accordance with one embodiment of the present disclosure.

Figure 4:
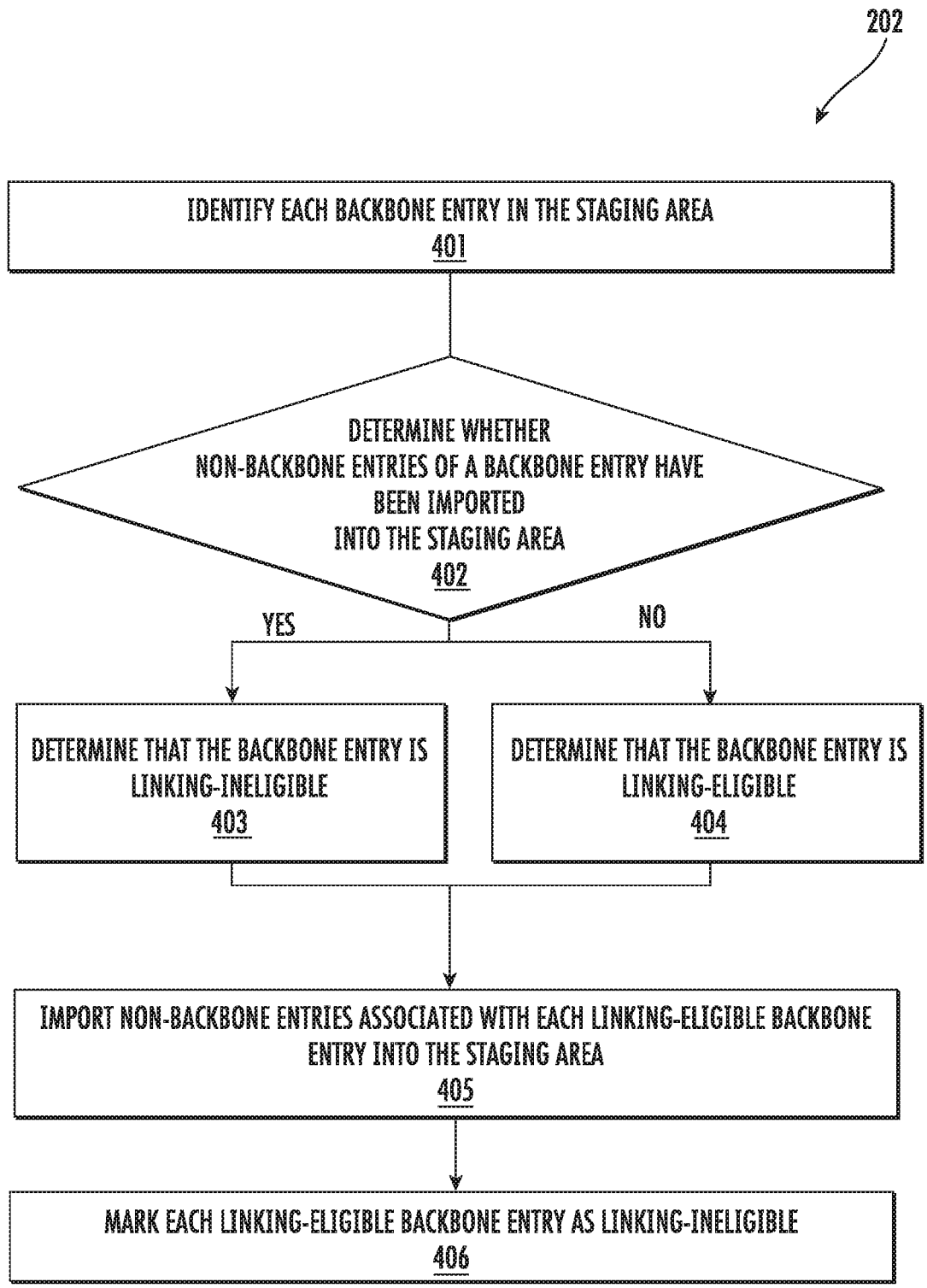

FIG. 4 is a flowchart diagram of an example process for performing a backbone-linking enrichment in accordance with one embodiment of the present disclosure.

Figure 5:
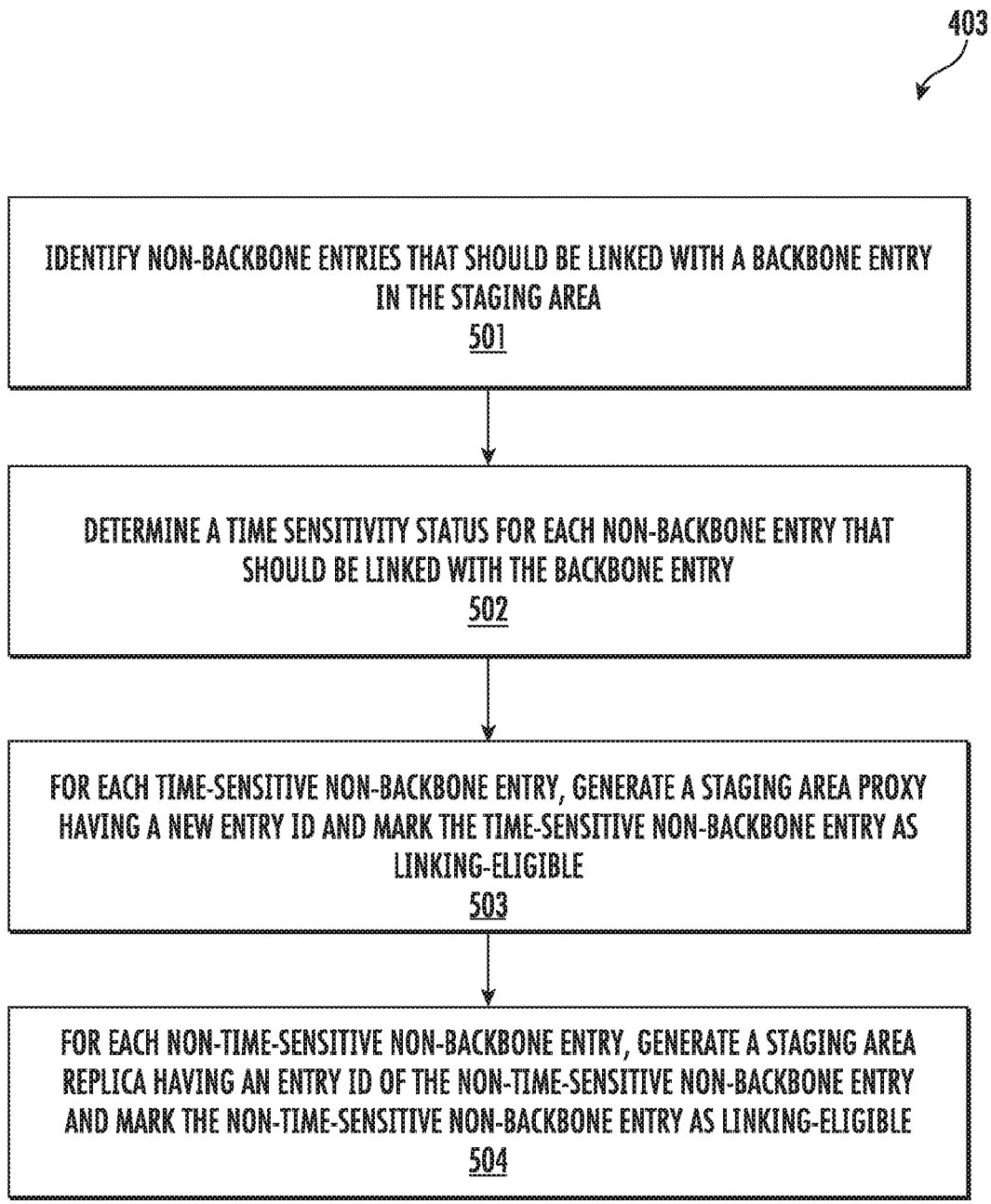

FIG. 5 is a flowchart diagram of an example process importing non-backbone entries associated with linking-eligible backbone entries into a staging area in accordance with one embodiment of the present disclosure.

Figure 6:
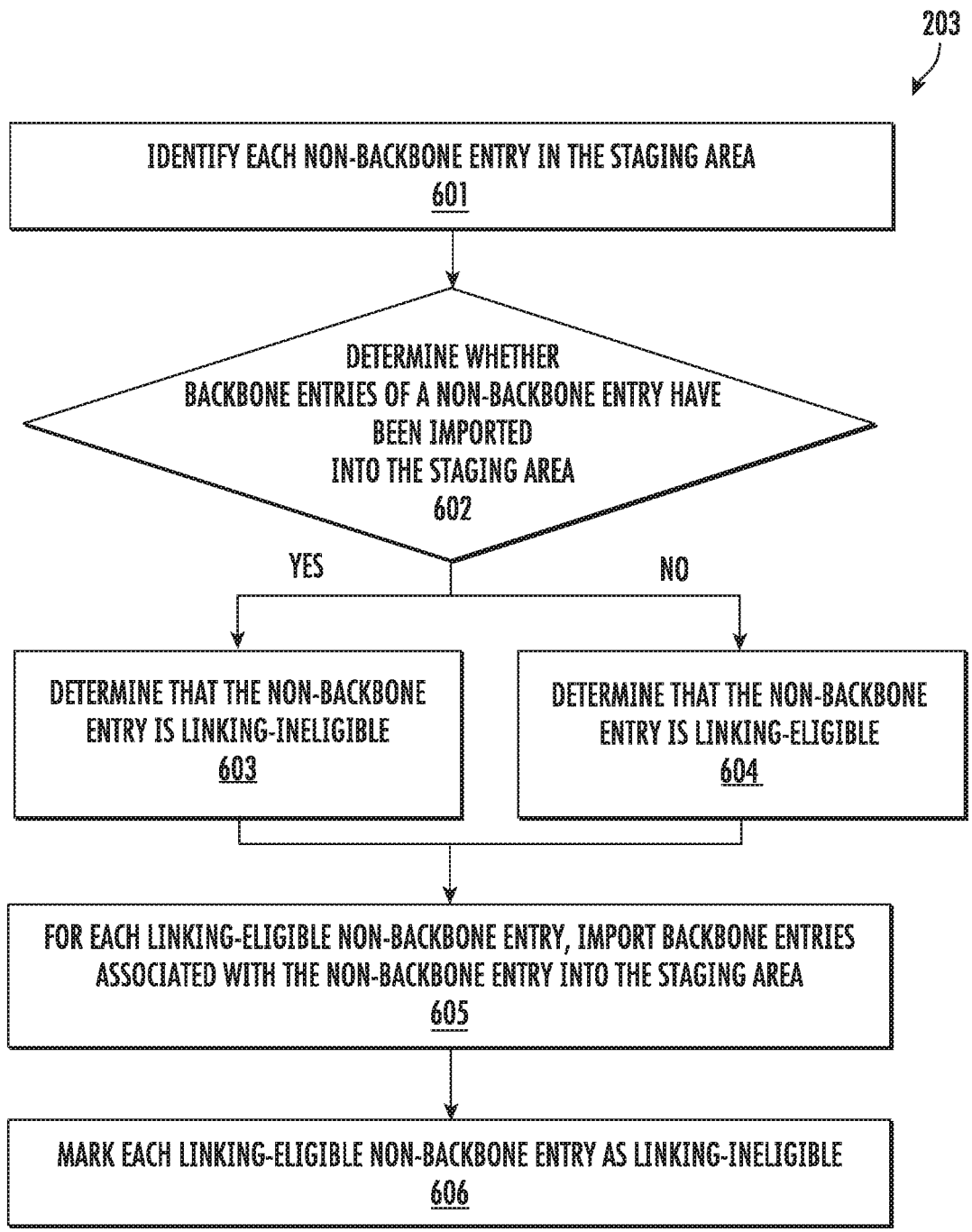

FIG. 6 is a flowchart diagram of an example process for performing a non-backbone-linking enrichment in accordance with one embodiment of the present disclosure.

Figure 7:
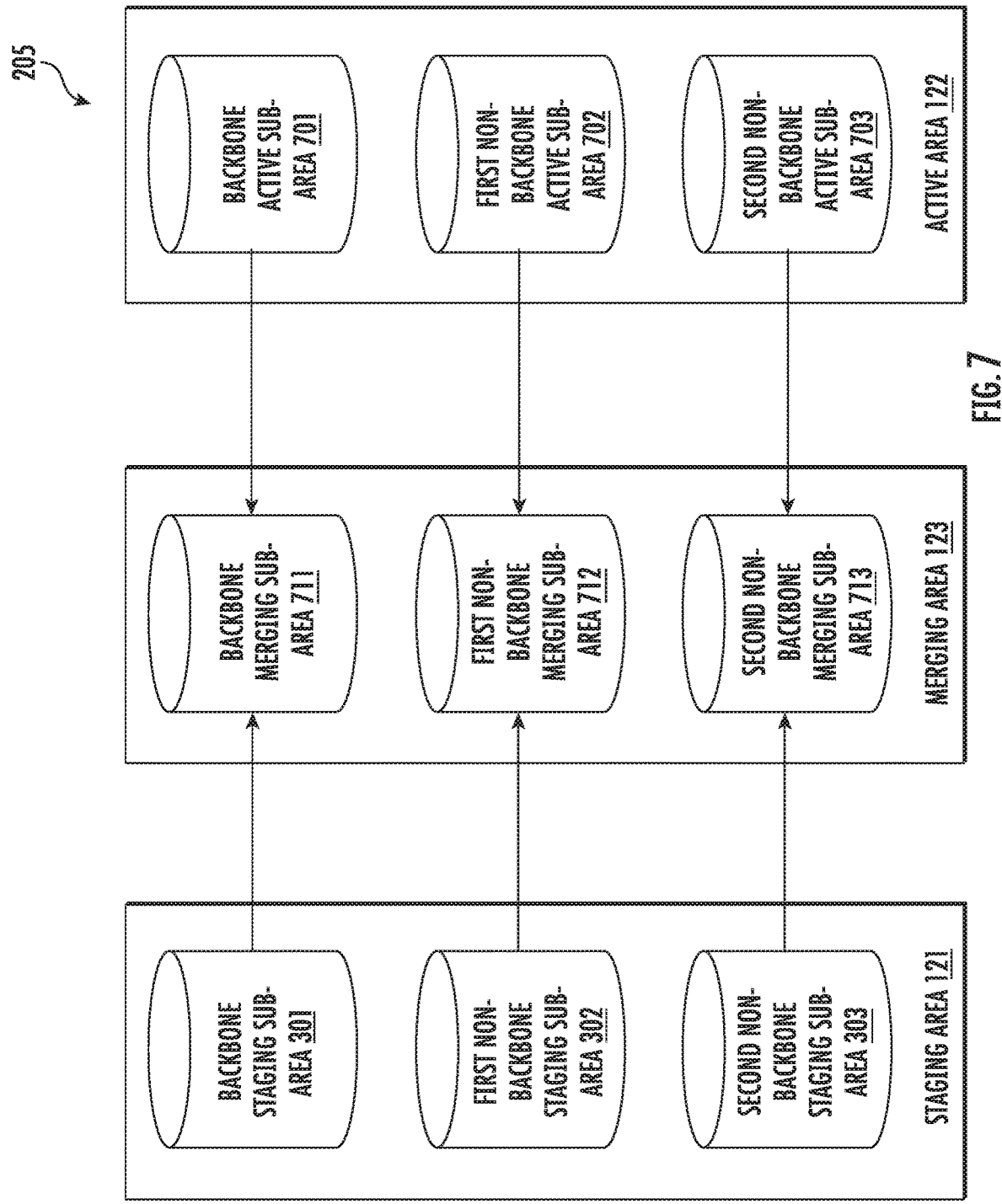

FIG. 7 is a data flow diagram of an example process for merging an active area and a staging area in accordance with one embodiment of the present disclosure.

Figure 8:
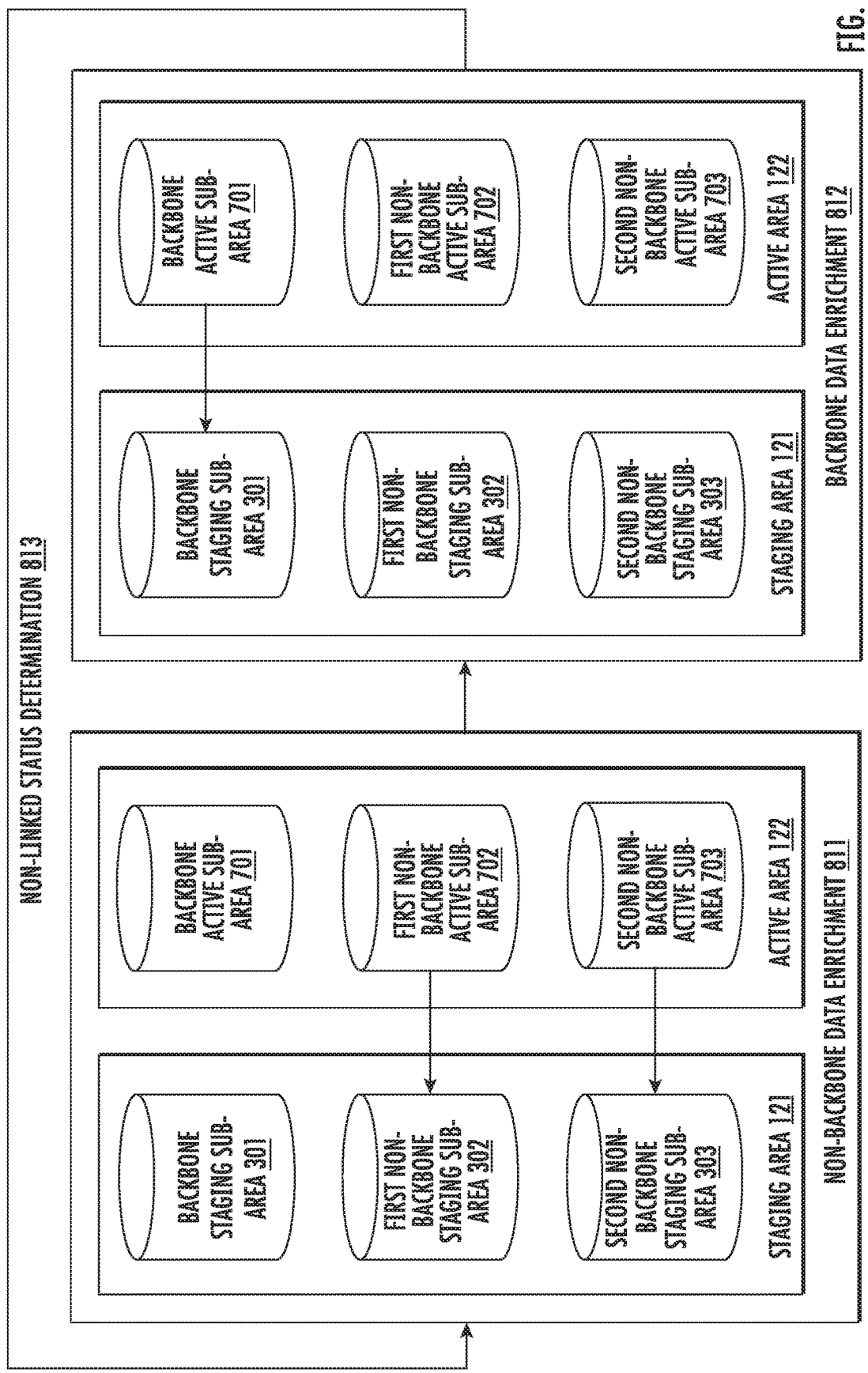

FIG. 8 is a data flow diagram of an example process for performing cross-data-source link enrichment in accordance with one embodiment of the present disclosure.

Figure 9A:
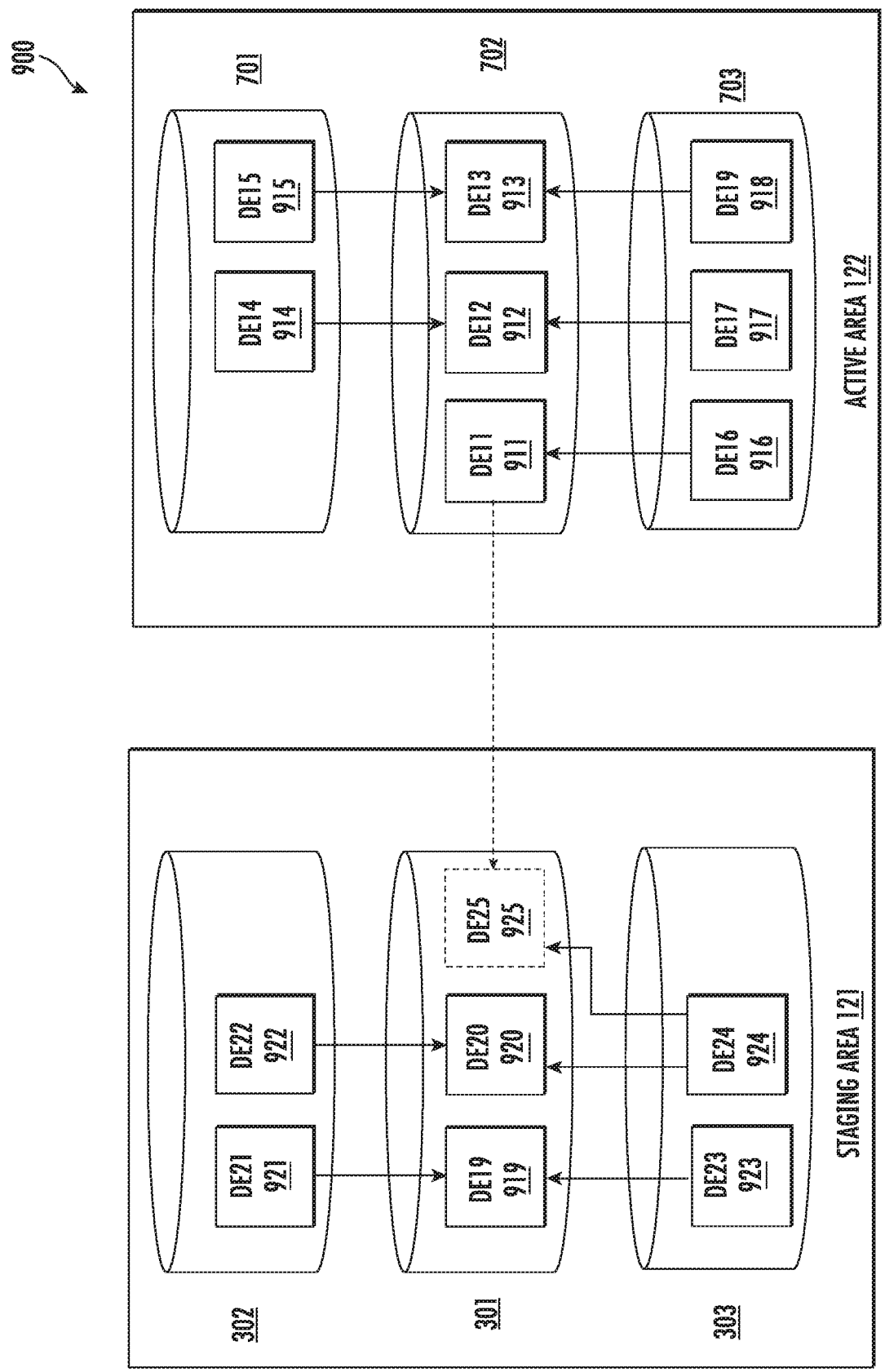

FIGS. 9A and 9B provide operational examples of a backbone data enrichment and a non-backbone data enrichment in accordance with one embodiment of the present disclosure.

Figure 10:
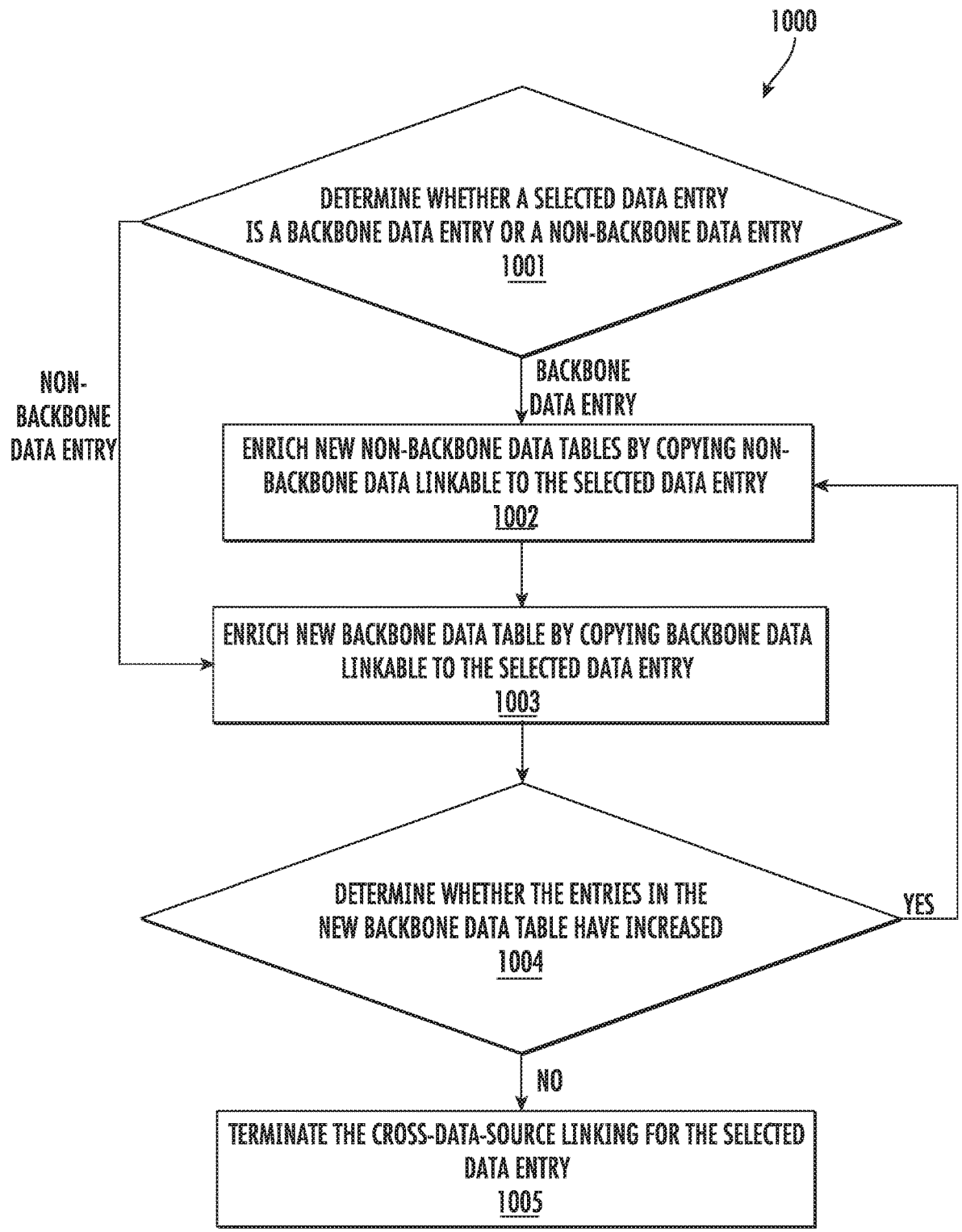

FIG. 10 is a flowchart diagram of an example process for performing cross-data-source linking for a selected data entry based on whether the selected data entry is a backbone data entry or a non-backbone data entry in accordance with one embodiment of the present disclosure.

Figure 11:
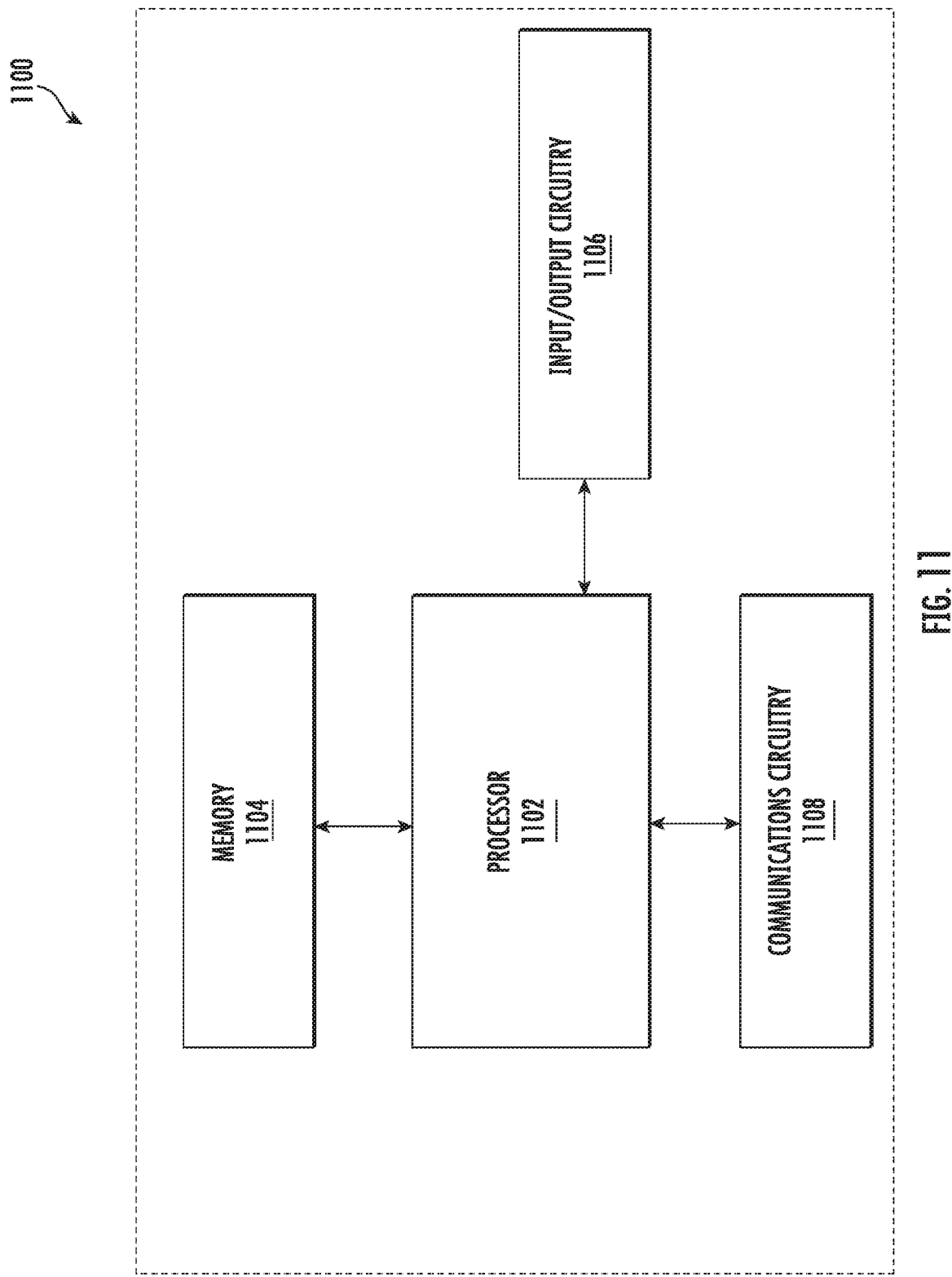

FIG. 11 is a schematic diagram of an example apparatus for a warehouse management computing device in accordance with one embodiment of the present disclosure.

Figure 12:
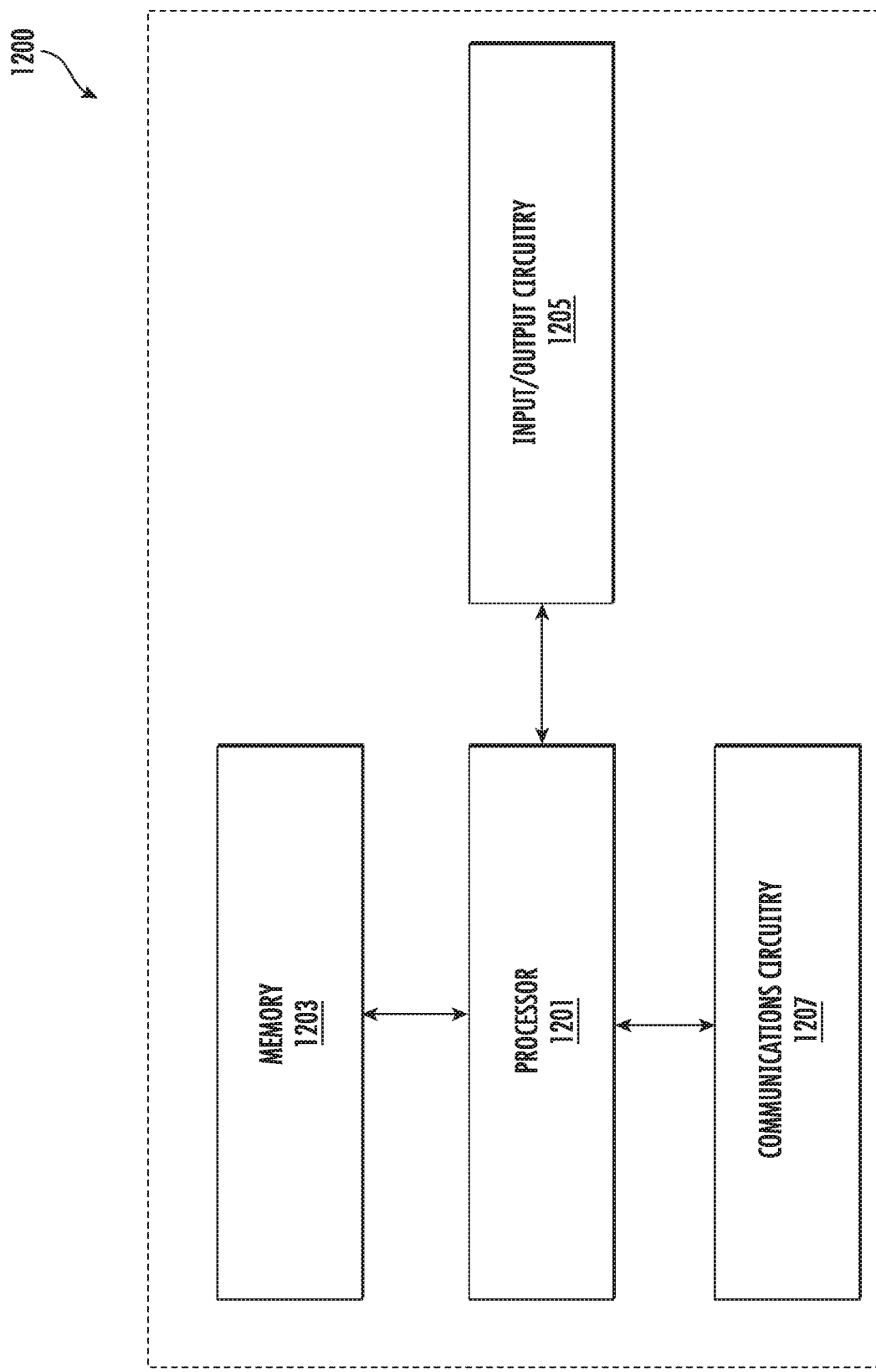

FIG. 12 is a schematic diagram of an example apparatus for a data source computing device in accordance with one embodiment of the present disclosure.

Figure 13:
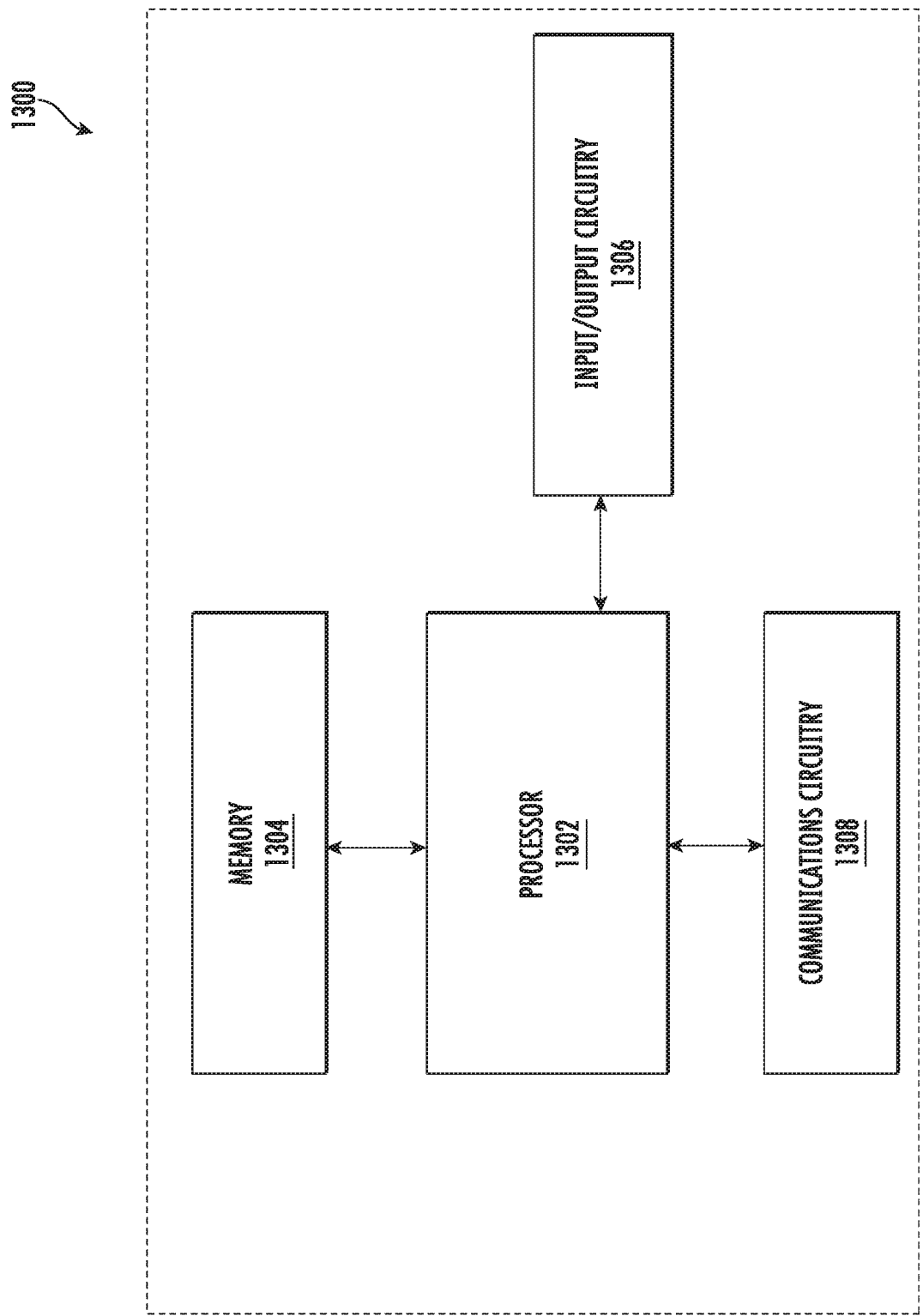

FIG. 13 is a schematic diagram of an example apparatus for a client computing device in accordance with one embodiment of the present disclosure.

Figure 14:
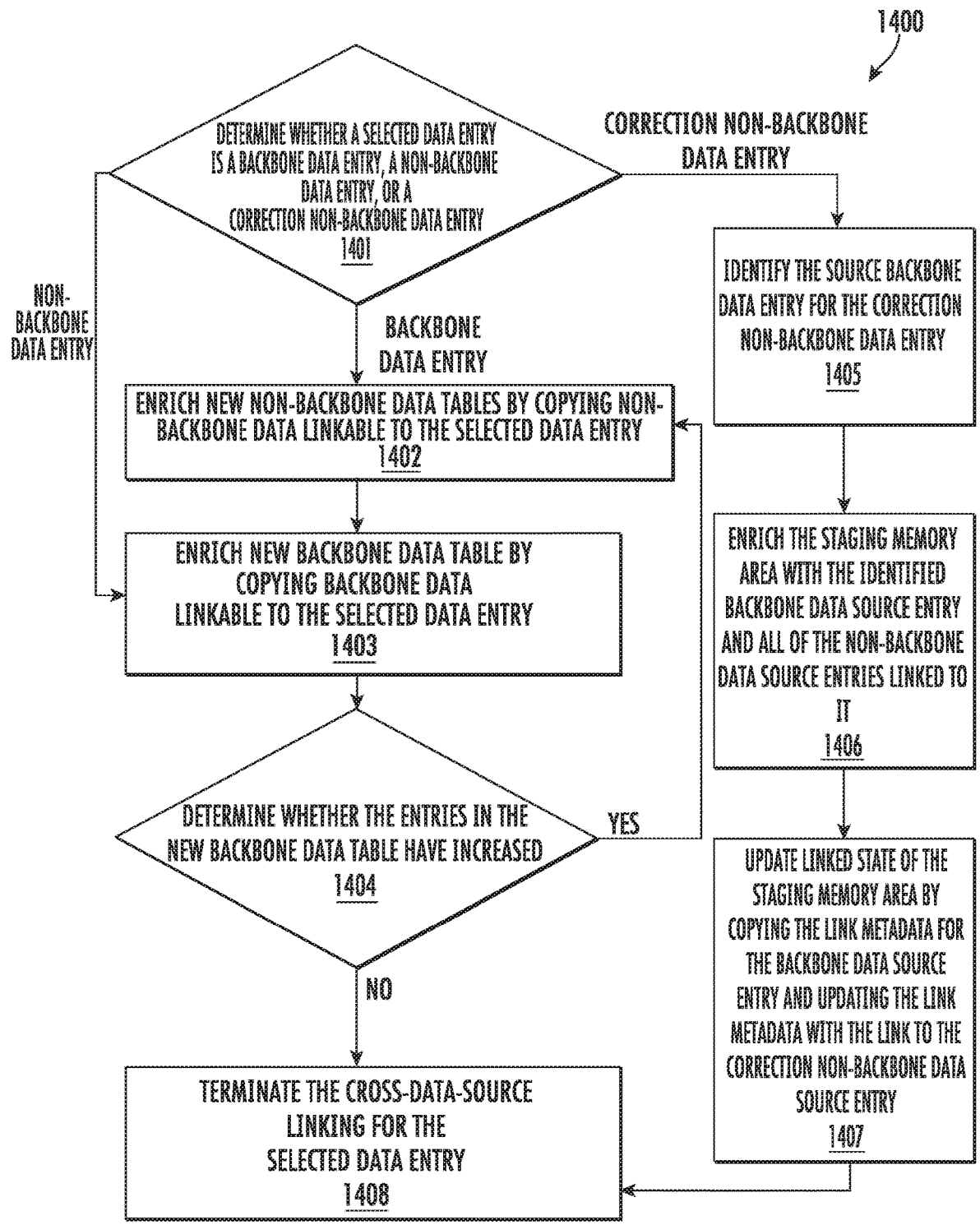

FIG. 14 is a flowchart diagram of an example process for performing cross-data-source linking for a selected data entry based on whether the selected data entry is a backbone data entry, a non-backbone data entry, or a correction non-backbone data entry in accordance with one embodiment of the present disclosure.

DETAILED DESCRIPTION OF VARIOUS EMBODIMENTS

Various embodiments of the present disclosure are described more fully hereinafter with reference to the accompanying drawings, in which some, but not all embodiments of the disclosure are shown. Indeed, the disclosure may be embodied in many different forms and should not be construed as limited to the embodiments set forth herein. Rather, these embodiments are provided so that this disclosure will satisfy applicable legal requirements. The term "or" is used herein in both the alternative and conjunctive sense, unless otherwise indicated. The terms "illustrative," "example," and "exemplary" are used to be examples with no indication of quality level. Like numbers refer to like elements throughout.

The term "comprising" means "including but not limited to," and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The terms "data," "content," "digital content," "digital content object," "information," and similar terms may be used interchangeably to refer to data capable of being transmitted, received, and/or stored in accordance with embodiments of the present disclosure. Thus, use of any such terms should not be taken to limit the spirit and scope of embodiments of the present disclosure. Further, where a device is described herein to receive data from another device, it will be appreciated that the data may be received directly from another device or may be received indirectly via one or more intermediary devices, such as, for example, one or more servers, relays, routers, network access points, base stations, hosts, and/or the like (sometimes referred to herein as a "network"). Similarly, where a device is described herein to send data to another device, it will be appreciated that the data may be sent directly to another device or may be sent indirectly via one or more intermediary devices, such as, for example, one or more servers, relays, routers, network access points, base stations, hosts, and/or the like.

The term "circuitry" should be understood broadly to include hardware and, in some embodiments, software for configuring the hardware. With respect to components of the apparatus, the term "circuitry" as used herein should therefore be understood to include particular hardware configured to perform the functions associated with the particular circuitry as described herein. For example, in some embodiments, "circuitry" may include processing circuitry, storage media, network interfaces, input/output devices, and the like.

The term "client device" refers to computer hardware and/or software that is configured to access a service made available by a server. The server is often (but not always) on another computer system, in which case the client device accesses the service by way of a network. Client devices may include, without limitation, smart phones, tablet computers, laptop computers, wearables, personal computers, enterprise computers, and the like.

Overview

Various example embodiments of the present disclosure address technological challenges related to efficiency of incremental cross-data-source linking in data warehouse systems. A data warehouse system is a computer system that is capable of storing, processing, and reporting data from multiple data sources. Currently, many existing data warehouse systems suffer from significant performance degradations, in some examples, due to their inability to efficiently link data across multiple data sources in order to produce complete data records. For example, many data warehouse systems associated with flight management systems cannot efficiently link data from various data sources (e.g., weather data sources, airport data sources, flight path data sources, airplane location data sources, airplane mechanical data sources, airplane fuel use data sources, etc.) by identifying which data entries relate to a given data warehouse entity (e.g., a given flight identifier). This in turn undermines the ability of many existing flight management systems to prepare timely flight-related reports and statistics (e.g., pre-flight reports for pilots, post-flight reports for pilots, real-time flight statistics for pilots or monitoring entities, etc.).

The inefficiency of many existing data warehouse systems in cross-data-source linking is in part, in some examples, because of the non-holistic nature of the cross-data-source linking techniques utilized by those data warehouse systems. In particular, many existing data warehouse systems perform linking for each data source separately, which means, in some examples, that each data source is processed apart from other data sources instead of in coordination with other data sources, thus increasing the time complexity of the cross-data-source linking tasks. The non-holistic cross-data-source linking techniques are especially ill-suited for larger data warehouse systems with high performance objects. Moreover, many existing data warehouse systems ensure completely linked data records by performing a full linking of data after each modification of data, another feature that incurs significant performance degradations and renders cross-data-source linking inefficient, time-consuming, and expensive. In a data warehouse system storing large data sets from a large number of data sources which has to obey complex conditions for linking data, cross-data-source linking can become quite time-intensive, especially when the subject of the linking is all the data stored by the data warehouse system. This time-intensiveness can in turn cause substantial efficiency and reliability challenges for data warehouse systems with shorter refresh cycles, such as data warehouse systems that aim to support real-time or near-real-time delivery and/or reporting of data.

Various embodiments of the present disclosure address technological challenges related to efficiency of cross-data-source linking in data warehouse systems by introducing example holistic approaches for cross-data-source linking in data warehouse systems. For example, in accordance with some example embodiments of the present disclosure, cross-data-source linking for various new data entries from various data sources is performed by: (i) importing the new data entries into a staging area, (ii) identifying which of the new data entries are new backbone data entries and which of the new data entries are new non-backbone data entries, (iii) importing any non-backbone data entry that should be linked to a new backbone data entry into the staging area as a new non-backbone data entry, (iv) importing any backbone data entry that should be linked to a new non-backbone data entry in to the staging area as a new backbone data entry, and (v) repeating steps (ii)-(iv) until an iteration in which step (iv) imports no backbone data entries (i.e., until importing the non-backbone data entries for each new backbone data entries have been completed). Through performing the noted technique and other cross-data-source linking techniques introduced herein, various embodiments of the present disclosure make substantial improvements to efficiency of cross-data-source linking in data warehouse systems, e.g., to efficiency of cross-data-source linking in data warehouse systems associated with flight management systems. For example, the noted technique and other example cross-data-source linking techniques introduced herein utilize conceptual linking patterns between backbone data sources and non-backbone data sources to enable holistic cross-data-source linking between data from various data sources in data warehouse systems. Such holistic cross-data-source linking in turn reduces time-intensiveness of cross-data-source linking in data warehouse systems, improves processor utilization, enables a reduction in both processing and memory resources and, thus, enables efficient (e.g., real-time or near-real-time) processing and reporting of data in data warehouse systems.

Example System Architecture for Implementing Embodiments of the Present Disclosure Methods, apparatuses, and computer program products of the present disclosure may be embodied by any of a variety of devices. For example, the method, apparatus, and computer program product of an example embodiment may be embodied by a networked device (e.g., an enterprise platform), such as a server or other network entity, configured to communicate with one or more devices, such as one or more client devices. Additionally, or alternatively, the device may include fixed devices, such as a personal computer or a computer workstation. Still further, example embodiments may be embodied by any of a variety of mobile devices, such as a portable digital assistant (PDA), mobile telephone, smartphone, laptop computer, tablet computer, wearable, or any combination of the aforementioned devices.

FIG. 1 illustrates an example architecture 100 within which embodiments of the present disclosure may operate. The architecture 100 includes a data warehouse system 101, one or more data source computing devices 102, and one or more client computing devices 103. The data warehouse system 101 in turn includes a warehouse management computing device 106 and a data warehouse 108. The data warehouse system 101, the one or more data source computing devices 102, and/or the one or more client computing devices 103 may communicate over a communication network (not shown). The communication network may include any wired or wireless communication network including, for example, a wired or wireless local area network (LAN), personal area network (PAN), metropolitan area network (MAN), wide area network (WAN), or the like, as well as any hardware, software and/or firmware required to implement it (such as, e.g., network routers, etc.). For example, communication network may include a cellular telephone, a 902.11, 902.16, 902.20, and/or WiMax network. Further, the communication network may include a public network, such as the Internet, a private network, such as an intranet, or combinations thereof, and may utilize a variety of networking protocols now available or later developed including, but not limited to TCP/IP based networking protocols. In one embodiment, the protocol is a custom protocol of JSON objects sent via a Websocket channel. In one embodiment, the protocol is JSON over RPC, JSON over REST/HTTP, and the like.

The architecture 100 may enable the data warehouse system 101 to store, process, and report data from various data sources. In particular, the data warehouse system 101 may receive data from various data sources associated with the data source computing devices 102, process the data to generate one or more data reports, and provide the one or more data reports to one or more client computing devices 103, e.g., in response to data report requests by the client computing devices 103. The warehouse management computing device 106 is configured to receive data from the various data sources associated with the data source computing devices 102, store the received data in the data warehouse 108, perform cross-data-source linking on the data stored in the data warehouse 108, generate data reports based on the linked data, and provide the generated data reports to the one or more client computing devices 103. The data warehouse 108 may include one or more non-volatile storage or memory media including but not limited to hard disks, ROM, PROM, EPROM, EEPROM, flash memory, MMCs, SD memory cards, Memory Sticks, CBRAM, PRAM, FeRAM, NVRAM, MRAM, RRAIVI, SONOS, FJG RAM, Millipede memory, racetrack memory, and/or the like.

The warehouse management computing device 106 includes an import unit 111, a linking unit 112, a merging unit 113, and an export unit 114. The import unit 111 is configured to receive data from the one or more data source computing devices 102 and store the received data in a staging area 122 of the data warehouse 108. The linking unit 112 is configured to generate a linked state for the data in the staging area 122 by importing data entries from an active area 121 of the data warehouse 108 into the staging area 122 and establishing links between the existing data in the staging area 122 and the imported data in the staging area 122. After the data in the staging area 122 reaches a linked state (as determined by the linking unit 112), the merging unit 113 utilizes a merging area 123 of the data warehouse 108 to merge the data in the active area 121 and the data in the staging area 122 to generate a new active area 121 with newly-received data properly linked with preexisting data. The export unit 114 utilizes the merged data to generate cross-data-source data reports and provide the generated cross-data-source data reports to the one or more client computing devices 103.

An example architecture for the warehouse management computing device 106 is depicted in the apparatus 1100 of FIG. 11. As depicted in FIG. 11, the apparatus 1100 includes processor 1102, memory 1104, input/output circuitry 1106, and communications circuitry 1108. Although these components 1102-1110 are described with respect to functional limitations, it should be understood that the particular implementations necessarily include the use of particular hardware. It should also be understood that certain of these components 1102-1112 may include similar or common hardware. For example, two sets of circuitries may both leverage use of the same processor, network interface, storage medium, or the like to perform their associated functions, such that duplicate hardware is not required for each set of circuitries.

In one embodiment, the processor 1102 (and/or co-processor or any other processing circuitry assisting or otherwise associated with the processor) may be in communication with the memory 1104 via a bus for passing information among components of the apparatus. The memory 1104 is non-transitory and may include, for example, one or more volatile and/or non-volatile memories. In other words, for example, the memory 1104 may be an electronic storage device (e.g., a computer-readable storage medium). The memory 1104 may be configured to store information, data, content, applications, instructions, or the like for enabling the apparatus to carry out various functions in accordance with example embodiments of the present disclosure.

The processor 1102 may be embodied in a number of different ways and may, for example, include one or more processing devices configured to perform independently. In some preferred and non-limiting embodiments, the processor 1102 may include one or more processors configured in tandem via a bus to enable independent execution of instructions, pipelining, and/or multithreading. The use of the term "processing circuitry" may be understood to include a single core processor, a multi-core processor, multiple processors internal to the apparatus, and/or remote or "cloud" processors.

In some preferred and non-limiting embodiments, the processor 1102 may be configured to execute instructions stored in the memory 1104 or otherwise accessible to the processor 1102. In some preferred and non-limiting embodiments, the processor 1102 may be configured to execute hard-coded functionalities. As such, if configured by hardware or software methods, or by a combination thereof, the processor 1102 may represent an entity (e.g., physically embodied in circuitry) capable of performing operations according to an embodiment of the present disclosure while configured accordingly. Alternatively, as another example, when the processor 1102 is embodied as an executor of software instructions, the instructions may specifically configure the processor 1102 to perform the algorithms and/or operations described herein when the instructions are executed.

In one embodiment, the apparatus 1100 may include input/output circuitry 1106 that may, in turn, be in communication with processor 1102 to provide output to the user and, in one embodiment, to receive an indication of a user input. The input/output circuitry 1106 may comprise a user interface and may include a display, and may comprise a web user interface, a mobile application, a client device, a kiosk, or the like. In one embodiment, the input/output circuitry 1106 may also include a keyboard, a mouse, a joystick, a touch screen, touch areas, soft keys, a microphone, a speaker, or other input/output mechanisms. The processor and/or user interface circuitry comprising the processor may be configured to control one or more functions of one or more user interface elements through computer program instructions (e.g., software and/or firmware) stored on a memory accessible to the processor (e.g., memory 1104, and/or the like).

The communications circuitry 1108 may be any means such as a device or circuitry embodied in either hardware or a combination of hardware and software that is configured to receive and/or transmit data from/to a network and/or any other device, circuitry, or module in communication with the apparatus 1100. In this regard, the communications circuitry 1108 may include, for example, a network interface for enabling communications with a wired or wireless communication network.

For example, the communications circuitry 1108 may include one or more network interface cards, antennae, buses, switches, routers, modems, and supporting hardware and/or software, or any other device suitable for enabling communications via a network. Additionally, or alternatively, the communications circuitry 1108 may include the circuitry for interacting with the antenna/antennae to cause transmission of commands via the antenna/antennae or to handle receipt of commands received via the antenna/antennae.

It is also noted that the information discussed herein is generated based on data that is received, generated and/or maintained by one or more components of apparatus 1100. In one embodiment, one or more external systems (such as a remote cloud computing and/or data storage system) may also be leveraged to provide at least some of the functionality discussed herein.

An example architecture for a data source computing device 102 is depicted in the apparatus 1200 of FIG. 12. As depicted in FIG. 12, the apparatus 1200 includes processor 1201, memory 1203, input/output circuitry 1205, and communications circuitry 1207. Although these components 1201-1207 are described with respect to functional limitations, it should be understood that the particular implementations necessarily include the use of particular hardware. It should also be understood that certain of these components 1201-1207 may include similar or common hardware. For example, two sets of circuitries may both leverage use of the same processor, network interface, storage medium, or the like to perform their associated functions, such that duplicate hardware is not required for each set of circuitries.

In one embodiment, the processor 1201 (and/or co-processor or any other processing circuitry assisting or otherwise associated with the processor) may be in communication with the memory 1203 via a bus for passing information among components of the apparatus. The memory 1203 is non-transitory and may include, for example, one or more volatile and/or non-volatile memories. In other words, for example, the memory 1203 may be an electronic storage device (e.g., a computer-readable storage medium). The memory 1203 may be configured to store information, data, content, applications, instructions, or the like for enabling the apparatus 1200 to carry out various functions in accordance with example embodiments of the present disclosure.

The processor 1201 may be embodied in a number of different ways and may, for example, include one or more processing devices configured to perform independently. In some preferred and non-limiting embodiments, the processor 1201 may include one or more processors configured in tandem via a bus to enable independent execution of instructions, pipelining, and/or multithreading.

In some preferred and non-limiting embodiments, the processor 1201 may be configured to execute instructions stored in the memory 1203 or otherwise accessible to the processor 1201. In some preferred and non-limiting embodiments, the processor 1201 may be configured to execute hard-coded functionalities. As such, if configured by hardware or software methods, or by a combination thereof, the processor 1201 may represent an entity (e.g., physically embodied in circuitry) capable of performing operations according to an embodiment of the present disclosure while configured accordingly. Alternatively, as another example, when the processor 1201 is embodied as an executor of software instructions, the instructions may specifically configure the processor 1201 to perform the algorithms and/or operations described herein when the instructions are executed.

In one embodiment, the apparatus 1200 may include input/output circuitry 1205 that may, in turn, be in communication with processor 1201 to provide output to the user and, In one embodiment, to receive an indication of a user input. The input/output circuitry 1205 may comprise a user interface and may include a display, and may comprise a web user interface, a mobile application, a client device, a kiosk, or the like. In one embodiment, the input/output circuitry 1205 may also include a keyboard, a mouse, a joystick, a touch screen, touch areas, soft keys, a microphone, a speaker, or other input/output mechanisms.

The communications circuitry 1207 may be any means such as a device or circuitry embodied in either hardware or a combination of hardware and software that is configured to receive and/or transmit data from/to a network and/or any other device, circuitry, or module in communication with the apparatus 1200. In this regard, the communications circuitry 1207 may include, for example, a network interface for enabling communications with a wired or wireless communication network. For example, the communications circuitry 1207 may include one or more network interface cards, antennae, buses, switches, routers, modems, and supporting hardware and/or software, or any other device suitable for enabling communications via a network. Additionally, or alternatively, the communications circuitry 1207 may include the circuitry for interacting with the antenna/antennae to cause transmission of commands via the antenna/antennae or to handle receipt of commands received via the antenna/antennae.

It is also noted that the information discussed herein is generated based on data that is received, generated and/or maintained by one or more components of apparatus 1200. In one embodiment, one or more external systems (such as a remote cloud computing and/or data storage system) may also be leveraged to provide at least some of the functionality discussed herein.

In one embodiment, other elements of the apparatus 1100 may provide or supplement the functionality of particular circuitry. For example, the processor 1102 may provide processing functionality, the memory 1104 may provide storage functionality, the communications circuitry 1108 may provide network interface functionality, and the like. Similarly, other elements of the apparatus 1200 may provide or supplement the functionality of particular circuitry. For example, the processor 1201 may provide processing functionality, the memory 1203 may provide storage functionality, the communications circuitry 1207 may provide network interface functionality, and the like.

An example architecture for the client computing device 103 is depicted in the apparatus 1300 of FIG. 13. As depicted in FIG. 13, the apparatus 1300 includes processor 1302, memory 1304, input/output circuitry 1306, and communications circuitry 1308. Although these components 1302-1310 are described with respect to functional limitations, it should be understood that the particular implementations necessarily include the use of particular hardware. It should also be understood that certain of these components 1302-1312 may include similar or common hardware. For example, two sets of circuitries may both leverage use of the same processor, network interface, storage medium, or the like to perform their associated functions, such that duplicate hardware is not required for each set of circuitries.

In one embodiment, the processor 1302 (and/or co-processor or any other processing circuitry assisting or otherwise associated with the processor) may be in communication with the memory 1304 via a bus for passing information among components of the apparatus. The memory 1304 is non-transitory and may include, for example, one or more volatile and/or non-volatile memories. In other words, for example, the memory 1304 may be an electronic storage device (e.g., a computer-readable storage medium). The memory 1304 may be configured to store information, data, content, applications, instructions, or the like for enabling the apparatus to carry out various functions in accordance with example embodiments of the present disclosure.

The processor 1302 may be embodied in a number of different ways and may, for example, include one or more processing devices configured to perform independently. In some preferred and non-limiting embodiments, the processor 1102 may include one or more processors configured in tandem via a bus to enable independent execution of instructions, pipelining, and/or multithreading. The use of the term "processing circuitry" may be understood to include a single core processor, a multi-core processor, multiple processors internal to the apparatus, and/or remote or "cloud" processors.

In some preferred and non-limiting embodiments, the processor 1302 may be configured to execute instructions stored in the memory 1304 or otherwise accessible to the processor 1302. In some preferred and non-limiting embodiments, the processor 1302 may be configured to execute hard-coded functionalities. As such, if configured by hardware or software methods, or by a combination thereof, the processor 1302 may represent an entity (e.g., physically embodied in circuitry) capable of performing operations according to an embodiment of the present disclosure while configured accordingly. Alternatively, as another example, when the processor 1302 is embodied as an executor of software instructions, the instructions may specifically configure the processor 1302 to perform the algorithms and/or operations described herein when the instructions are executed.

In one embodiment, the apparatus 1300 may include input/output circuitry 1306 that may, in turn, be in communication with processor 1302 to provide output to the user and, in one embodiment, to receive an indication of a user input. The input/output circuitry 1306 may comprise a user interface and may include a display, and may comprise a web user interface, a mobile application, a client device, a kiosk, or the like. In one embodiment, the input/output circuitry 1306 may also include a keyboard, a mouse, a joystick, a touch screen, touch areas, soft keys, a microphone, a speaker, or other input/output mechanisms. The processor and/or user interface circuitry comprising the processor may be configured to control one or more functions of one or more user interface elements through computer program instructions (e.g., software and/or firmware) stored on a memory accessible to the processor (e.g., memory 1304, and/or the like).

The communications circuitry 1308 may be any means such as a device or circuitry embodied in either hardware or a combination of hardware and software that is configured to receive and/or transmit data from/to a network and/or any other device, circuitry, or module in communication with the apparatus 1300. In this regard, the communications circuitry 1308 may include, for example, a network interface for enabling communications with a wired or wireless communication network.

For example, the communications circuitry 1308 may include one or more network interface cards, antennae, buses, switches, routers, modems, and supporting hardware and/or software, or any other device suitable for enabling communications via a network. Additionally or alternatively, the communications circuitry 1308 may include the circuitry for interacting with the antenna/antennae to cause transmission of commands via the antenna/antennae or to handle receipt of commands received via the antenna/antennae.

It is also noted that the information discussed herein is generated based on data that is received, generated and/or maintained by one or more components of apparatus 1300. In one embodiment, one or more external systems (such as a remote cloud computing and/or data storage system) may also be leveraged to provide at least some of the functionality discussed herein.

As will be appreciated, any such computer program instructions and/or other type of code may be loaded onto a computer, processor or other programmable apparatus's circuitry to produce a machine, such that the computer, processor or other programmable circuitry that execute the code on the machine creates the means for implementing various functions, including those described herein.

As described above and as will be appreciated based on this disclosure, embodiments of the present disclosure may be configured as methods, mobile devices, backend network devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Any suitable computer-readable storage medium may be utilized including non-transitory hard disks, CD-ROMs, flash memory, optical storage devices, or magnetic storage devices.

Example Data Flows of Embodiments of the Present Disclosure

Various embodiments of the present disclosure address technological challenges related to efficiency of cross-data-source linking in data warehouse systems by introducing example holistic approaches for cross-data-source linking in data warehouse systems. For example, in accordance with example embodiments of the present disclosure, cross-data-source linking for various new data entries from various data sources is performed by: (i) importing the new data entries into a staging area, (ii) identifying which of the new data entries are new backbone data entries and which of the new data entries are new non-backbone data entries, (iii) importing any non-backbone data entry that should be linked to a new backbone data entry into the staging area as a new non-backbone data entry, (iv) importing any backbone data entry that should be linked to a new non-backbone data entry in to the staging area as a new backbone data entry, and (v) repeating steps (ii)-(iv) until an iteration in which step (iv) imports no new backbone data entries (i.e., until importing the non-backbone data entries for each new backbone data entries have been completed). Through performing the noted technique and other cross-data-source linking techniques introduced herein, various embodiments of the present disclosure, in some examples, make substantial improvements to efficiency of cross-data-source linking in data warehouse systems, (e.g., to efficiency of cross-data-source linking in data warehouse systems associated with flight management systems). For example, the noted technique and other cross-data-source linking techniques introduced herein utilize conceptual linking patterns between backbone data sources and non-backbone data sources to enable holistic cross-data-source linking between data from various data sources in data warehouse systems. Such example holistic cross-data-source linking in turn reduces time-intensiveness of cross-data-source linking in data warehouse systems, thus enabling efficient (e.g., real-time or near-real-time) processing and reporting of data in data warehouse systems.

Generating Cross-Data-Source Reports

FIG. 2 is a flowchart diagram of an example process 200 for generating cross-data-source data reports. Through the various steps/operations of process 200, a system of one or more computers (e.g., the data warehouse system 101 of FIG. 1) can perform cross-data-source linking for data from multiple data sources and generate data reports based on the linked data. Process 200 will now be described with reference to the data warehouse system 101 of FIG. 1.

Process 200 begins at block 201 where the import unit 111 imports incoming data into the staging area 122. In some embodiments, the import unit 111 retrieves the incoming data from the one or more data source computing devices 102 and stores the retrieved incoming data in the staging area 122. Examples of incoming data include, but are not limited to, weather data; airport data; flight path data; airplane location data; airplane mechanical data; airplane fuel use data; building maintenance data; manufacturing plant data; heating, ventilation, and air-conditioning (HVAC) plant data; system monitoring data (e.g., computer network monitoring data); etc. The incoming data may be associated with various data sources. In some embodiments, the linking conditions of the data warehouse system 101 require that links between data entries extend from data entries associated with particular data sources to data entries associated with other data sources. The first group of data sources from which links originate are known as non-backbone data sources and their respective data entries are known as non-backbone data entries. The second group of data sources to which links between data entries extend are known as backbone data sources and their respective data entries are known as backbone data entries. In some embodiments, one or more backbone data sources include data sources to which all other (non-backbone) data sources are linked. In some embodiments, one or more backbone data sources include data sources deemed to contain enough information to facilitate linking from any other data source. For example, in the case of a flight management system, the one or more backbone data sources may include a data source that contains scheduling information for the flights and provide details such as flight identifications for flights, aircraft identification for flights, departure and arrival airports for flights, departure and arrival times for flights, passenger details for flights, etc., all pieces of data that facilitate linking to more-specified data sources (such as data sources that contain extended information about the airports, aircrafts, weathers, etc.).

In some embodiments, linking conditions of the data warehouse system 101 define one backbone data source and one or more non-backbone data sources. For example, data entries from a flight path data source, an airport location data source, and a weather data source may all have links to data entries of a flight identifier data source, as the data entries in the latter data source defines database entities to which the data entries in the former data source each relate. In this example, the flight identifier data source may be the backbone data source while the flight path data source, the airport location data source, and the weather data source may be non-backbone data sources. In some other embodiments, linking conditions of the data warehouse system 101 define two or more backbone data sources. For example, data entries from a flight path data source, an airport location data source, and a weather data source may all have links to data entries of either one of an on-time flight identifier data source and a delayed flight identifier data source. In this example, the on-time flight identifier and the delayed flight identifier may be backbone data sources, while the flight path data source, the airport location data source, and the weather data source may be non-backbone data sources. As another example, data entries from a flight path data source, a flight departure time data source, and a flight speed data source may all have links to data entries of both a pilot identifier data source and a co-pilot identifier data source. In this example, the pilot identifier data source and the co-pilot identifier data source may be backbone data sources, while the flight path data source, the flight departure time data source, and the flight speed data source may be non-backbone data sources. In some embodiments, one or more backbone data sources and/or one or more non-backbone data sources may be preselected and/or predefined (e.g., based on linking configuration data associated with the data warehouse system 101).

In some embodiments, the various steps/operations of block 201 may be performed in accordance with the various steps/operations of FIG. 3, which is a data flow diagram of an example process for importing incoming data into the staging area 122. As depicted in FIG. 3, importing incoming data into the staging area 122 may be performed in one iteration for all incoming data available at each time regardless of the source of each incoming data entry. In particular, as depicted in FIG. 3, the import unit 111 imports data from three data sources DS1, DS2, and DS3, where DS1 is the backbone data source and DS2-DS3 are non-backbone data sources. While the example process depicted in FIG. 3 depicts importing incoming data entries from three data sources including one backbone data source and two non-backbone data sources, a person of ordinary skill in the art will recognize that the import unit 111 may import incoming data from any number of data sources, any number of backbone data sources, and any number of non-backbone data sources.

The process depicted in FIG. 3 includes storing data from each data source in a staging sub-area for the data source in the staging area 122. In particular, the import unit 111 stores incoming DS1 data 311 in a backbone staging sub-area 301 for the backbone data source DS1. Furthermore, the import unit 111 stores incoming DS2 data 312 in a first non-backbone staging sub-area 302 for the non-backbone data source DS2. Moreover, the import unit 111 stores incoming DS3 data 313 in a second non-backbone staging sub-area 303 for the non-backbone data source DS3.

Returning to FIG. 2, at block 202, the linking unit 112 performs a backbone-linking enrichment of the staging area 122 based on each linking-eligible backbone entry in the staging area 122. In some embodiments, the linking unit 112 identifies each backbone entry in the staging area 122 that is linking-eligible (e.g., each backbone entry in the staging area 122 whose associated non-backbone entries have not been imported into the staging area 122). The linking unit 112 then imports each non-backbone entry associated with a linking-eligible backbone entry into the staging area 122 and establishes a link between the imported non-backbone entry and its associated linking-eligible backbone entry.

In some embodiments, the various steps/operations of block 202 may be performed in accordance with the various steps/operations of FIG. 4, which is a flowchart diagram of an example process for performing a backbone-linking enrichment of the staging area 122 based on each linking-eligible backbone entry in the staging area 122. The process depicted in FIG. 4 begins at block 401 when the linking unit 112 identifies each backbone entry in the staging area 122.

At block 402, the linking unit 112 determines, for each backbone entry in the staging area 122, whether non-backbone entries associated with the backbone entry have been imported into the staging area 122. At block 403 in response to determining that non-backbone entries associated with a backbone entry have been imported into the staging area 122, the linking unit 112 determines that the backbone entry is linking-ineligible. At block 404, in response to determining that non-backbone entries associated with a backbone entry have not been imported into the staging area 122, the linking unit 112 determines that the backbone entry is linking-eligible.

At block 405, the linking unit 112 imports non-backbone entries associated with each linking-eligible backbone entry into the staging area 122. In some embodiments, the linking unit 112 determines which particular non-backbone entries from the active area 121 should have a link to a linking-eligible backbone entry in the staging area 122, imports the particular non-backbone entries into the staging area 122, and establishes links between linking-eligible backbone entries and the particular non-backbone entries in the staging area 122.

In some embodiments, the various steps/operations of block 403 may be performed in accordance with the various steps/operations of FIG. 5, which is a flowchart diagram of an example process for importing non-backbone entries associated with linking-eligible backbone entries into the staging area 122. The process depicted in FIG. 5 begins at block 501 when the linking unit 112 identifies non-backbone entries that should be linked with a linking-eligible backbone entry in the staging area 122. At block 502, the linking unit 112 determines a time sensitivity status for each non-backbone entry that should be linked with the backbone entry. In some example embodiments, the linking unit determines a time sensitivity status for a non-backbone entry based on a prediction about likelihood of change of the non-backbone entry over time. For example, airport information data entries may be deemed less likely to change and thus non-time-sensitive, while weather-related data entries may be deemed more likely to change and thus time-sensitive.

At block 503, for each time-sensitive non-backbone entry, the linking unit 112 generates a staging area proxy having a new entry identifier and marks the time-sensitive non-backbone entry as linking-eligible. In some embodiments, the linking unit 112 copies each time-sensitive non-backbone entry as a new data entry having a new data entry identifier. In some embodiments, the linking unit 112 marks each time-sensitive non-backbone entry as linking-eligible, which in turn may cause an importing of backbone data entries associated with the non-backbone entries in subsequent steps.

At block 504, for each non-time-sensitive non-backbone entry, the linking unit 112 generates a staging area replica having an entry identifier of the non-time-sensitive non-backbone entry and marks the non-time-sensitive non-backbone entry as linking-ineligible. In some embodiments, the linking unit 112 copies each non-time-sensitive non-backbone entry as a replica data entry that is a mirrored image of the non-time-sensitive non-backbone data entry having the entry identifier of the non-time-sensitive non-backbone entry. In some embodiments, the linking unit 112 marks each non-time-sensitive non-backbone entry as linking-ineligible, which in turn may cause backbone data entries associated with the non-backbone entries to not be imported in subsequent steps. This non-importation may, in some examples, be because non-sensitive data entries may be deemed to likely have an excessive number of associated backbone data entries and/or an excessive number of conceptually insignificant links with associated backbone data entries. In some embodiments, by utilizing this non-importation of backbone entries associated with non-time-sensitive non-backbone entries, the linking unit 112 can reduce the number of iterations of various/steps operations of blocks 202-204 and thus increase the overall computational efficiency and time complexity of process 200. In some embodiments, non-time-sensitive data entries are deemed to in general rarely change and/or to be small in size, which renders a full mirroring of such data entries computationally efficient and/or storage-wise efficient.

Returning to FIG. 4, at block 406, the linking unit 112 marks each linking-eligible backbone entry as linking-ineligible. In some embodiments, after importing each non-backbone entry associated with a linking-eligible backbone entry, the linking unit 112 marks the linking-eligible backbone entry as linking-ineligible to prevent future importations of non-backbone entries associated with the particular backbone entry.

Returning to FIG. 2, at block 203, the linking unit 112 performs a non-backbone-linking enrichment of the staging area 122 based on each linking-eligible non-backbone entry in the staging area 122. In some embodiments, the linking unit 112 identifies each non-backbone entry in the staging area 122 that is linking-eligible (e.g., each non-backbone entry in the staging area 122 whose associated backbone entries have been imported into the staging area 122). The linking unit 112 then imports each backbone entry associated with a linking-eligible non-backbone entry into the staging area 122 and establishes a link between the imported backbone entry and its associated linking-eligible non-backbone entry.

In some embodiments, the various steps/operations of block 202 may be performed in accordance with the various steps/operations of FIG. 6, which is a flowchart diagram of an example process for performing a non-backbone-linking enrichment of the staging area 122 based on each linking-eligible non-backbone entry in the staging area 122. The process depicted in FIG. 6 begins at block 601 when the linking unit 112 identifies each non-backbone entry in the staging area 122.

At block 602, the linking unit 112 determines, for each non-backbone entry in the staging area 122, whether the backbone entries associated with the non-backbone entry have been imported into the staging area 122. At block 603, in response to determining that backbone entries associated with a non-backbone entry have been imported into the staging area 122, the linking unit 112 determines that the non-backbone entry is linking-ineligible. At block 604, in response to determining that backbone entries associated with a non-backbone entry have not been imported into the staging area 122, the linking unit 112 determines that the non-backbone entry is linking-eligible.

At block 605, the linking unit 112 imports backbone entries associated with each linking-eligible non-backbone entry into the staging area 122. In some embodiments, the linking unit 112 determines which particular backbone entries from the active area 121 should have a link to a linking-eligible non-backbone entry in the staging area 122, imports the particular backbone entries into the staging area 122, and establishes links between linking-eligible non-backbone entries and the particular backbone entries in the staging area 122.

At block 606, the linking unit 112 marks each linking-eligible non-backbone entry as linking-ineligible. In some embodiments, after importing each backbone entry associated with a linking-ineligible backbone entry, the linking unit 112 marks the linking-eligible non-backbone entry as linking-ineligible to prevent future importations of backbone entries associated with the particular non-backbone entry.

Returning to FIG. 2, at block 204, the linking unit 112 determines whether the staging area 122 is in a linked state. In some embodiments, to determine whether the staging area is in a linked state, the linking unit 112 determines whether there are any linking-eligible backbone entries in the staging area 122. In some embodiments, in response to determining that there is no linking-eligible backbone entries in the staging area 122, the linking unit determines that the staging area 122 is in a linked state. In some embodiments, in response to determining that there is at least one linking-eligible backbone entry in the staging area 122, the linking unit determines that the staging area 122 is not in a linked state. In some embodiments, to determine whether the staging area 122 is in a linked state, the linking unit 112 determines whether there are any backbone data entries whose associated non-backbone entries have not been imported into the staging area 122. In some embodiments, in response to determining that there are no backbone data entries whose associated non-backbone entries have not been imported into the staging area 122, the linking unit 112 determines that the staging area 122 is in a linked state. In some embodiments, in response to determining that there is at least one backbone data entry whose associated non-backbone entries have not been imported into the staging area 122, the linking unit determines that the staging area 122 is not in a linked state.

If the linking unit 112 determines at block 204 that the staging area 122 is not in a linked state, the linking unit 112 repeats the various steps/operations of blocks 202-204 until the staging area 122 is in a linked state. In some embodiments, the linking unit 112 continues to import non-backbone entries associated with linking-eligible backbone entries and backbone entries associated with linking-eligible non-backbone entries until an iteration in which the various steps/operations of block 203 fail to import any new backbone entries, at which point the linking unit 112 may determine that the data in the staging area 122 has reached a linked state as there are no new entries whose associated entries have not been imported into the staging area 122.

If the linking unit 112 determines at block 204 that the staging area 122 is in a linked state, the process 200 proceeds to block 205 where the merging unit 113 merges the staging area 122 with the active area 121 to update the active area 121. In some embodiments, the merging unit 113 generates new linking data by combining the linking data in the active area 121 and the linking data in the staging area 122. In some embodiments, after each importing of a data entry according to various steps/operations of one of the blocks 202 or 203, the linking unit 112 marks the imported data entry as inactive in the active area 121 (e.g., by setting an inactive value for a flag associated with the imported data entry in configuration data stored in the staging area 122). In some of those embodiments, to merge the active area 121 and the staging area 122, the merging unit 113 copies one or both of the active data in the active area 121 and the data in the staging area 122 in a common location in the data warehouse 108 (e.g., the active area 121, the staging area 122, and/or the merging area 123).

In some embodiments, to merge the active area 121 and the staging area 122, the merging unit 113 copies data from the staging area 122 and the data from the active area 121 that is not found in the staging area 122 into a common location in the data warehouse 108. In some embodiments, to merge the active area 121 and the staging area 122, the merging unit 113 copies metadata from the staging area 122 and metadata from the active area 121 that is not found in the staging area 122 into a common location in the data warehouse 108. In some embodiments, the merging unit 113 generates a new active area 121 based on the data resulting from merging the existing active area 121 and the staging area 122. In some embodiments, to update the active area 121, the merging unit 113 rewrites data in the existing active area 121 based on the data resulting from merging the existing active area 121 and the staging area 122.

In some embodiments, the various steps/operations of block 204 can be performed in accordance with the various steps/operations of FIG. 7, which is a data flow diagram of an example process for merging the active area 121 and the staging area 122. As depicted in FIG. 7, to merge data from each data source that exists in either the active area 121 or the staging area 122, the merging unit 113 can transfer such data from a sub-area for the data source in either the active area 121 or the staging area 122 to a sub-area for the data source in the merging area 123. For example, to merge data for backbone data source DS1, the merging unit 113 transfers data from the backbone staging sub-area 301 in the staging area 122 and from the backbone active sub-area 701 in the active area 121 to the backbone merging sub-area 711 in the merging area 123. Furthermore, to merge data for non-backbone data source DS2, the merging unit 113 transfers data from the first non-backbone staging sub-area 302 in the staging area 122 and from the first non-backbone active sub-area 702 in the active area 121 to the first non-backbone merging sub-area 712 in the merging area 123. Moreover, to merge data for non-backbone data source DS3, the merging unit 113 transfers data from the second non-backbone staging sub-area 303 in the staging area 122 and from the second non-backbone active sub-area 703 in the active area 121 to the second non-backbone merging sub-area 713 in the merging area 123.

Returning to FIG. 2, at block 206, the export unit 114 generates one or more cross-data-source reports based on the data in the active area 121. In some embodiments, after merging the active area 121 and the merging area 122 to update the active area 121, the export unit 114 utilizes the data in the updated active area 121 to generate one or more cross-data-source reports. Examples of cross-data-source reports include real-time or near-real-time data analysis reports, such as real-time or near real-time flight analysis reports and/or real-time or near-real-time fuel efficiency reports.

Iterative Cross-Data-Source Link Enrichment

FIG. 8 is a data flow diagram of an example process 800 for performing cross-data-source link enrichment. Via the various steps/operations of process 800, a system of one or more computers (e.g., the data warehouse system 101 of FIG. 1) can perform cross-data-source linking of data from multiple data sources by utilizing the active area 121 and the staging area 122. The process 800 will now be described with reference to the data warehouse system 101 of FIG. 1.

The process 800 includes a non-backbone enrichment phase 811 and a backbone enrichment phase 812 that get repeated as long as the linking unit 112 generates a non-linked status determination 813 for the staging area 122 (i.e., until the linking unit 112 determines that the staging area 122 is in a linked state). The non-backbone enrichment phase 811 includes importing non-backbone data from the active area 121 (e.g., from the first non-backbone active sub-area 702 and/or the second non-backbone active sub-area 703) into the staging area 122 (e.g., into the first non-backbone staging sub-area 302 and/or the second non-backbone staging sub-area 303). The non-backbone data imported during the non-backbone enrichment phase 811 may be non-backbone data deemed to be linkable and/or linked to particular backbone data in the staging area 122 whose associated non-backbone data entries have not previously been imported to the staging area 122 during an earlier iteration. In some embodiments, during a first iteration of the process 800, the non-backbone data imported during the non-backbone enrichment phase 811 may be non-backbone data deemed to be linkable and/or linked to any backbone data in the incoming data. In some embodiments, if the incoming data does not include any backbone data, the linking unit 112 may skip the non-backbone enrichment phase 811 during the first iteration and start with the backbone enrichment phase 812. In some embodiments, non-backbone data imported during each iteration of the non-backbone enrichment phase 811 may be stored in non-backbone data tables stored in the staging area 122.

The backbone enrichment phase 812 includes importing backbone data from the active area 121 (e.g., from the backbone active sub-area 701) into the staging area 122 (e.g., to the backbone staging sub-area 301). The backbone data imported during the backbone enrichment phase 812 may be backbone data deemed to be linkable and/or linked to particular non-backbone data in the staging area 122 whose associated backbone data entries have not previously been imported to the staging area 122 during an earlier iteration. If the backbone enrichment phase 812 fails to import any backbone data entries, the linking unit 112 may prevent generation of the non-linked status determination 813, which in turn may cause the process 800 to terminate. In some embodiments, backbone data imported during each iteration of the backbone enrichment phase 812 may be stored in backbone data tables stored in the staging area 122.

FIGS. 9A-9B provide operational examples 900, 950 of performing backbone enrichment phase 812 and the non-backbone enrichment phase 811 respectively. The operational example 900 of FIG. 9A depicts data entries DE11-24 911-924, where data entries DE11-13 911-913 reside on the backbone active sub-area 701 of the active area 121, data entries DE14-15 914-915 reside on the first non-backbone active sub-area 702 of the active area 121, data entries DE16-18 916-918 reside on the second non-backbone active sub-area 703 of the active area 121, data entries DE19-20 919-920 reside on the backbone staging sub-area 301 of the staging area 122, data entries DE21-222 921-922 reside on the first non-backbone staging sub-area 302 of the staging area 122, and data entries DE23-24 923-924 reside on the second non-backbone staging sub-area 303 of the staging area 122. The operational example 900 further depicts data entry DE25 925, which has resulted from copying backbone data entry DE11 911. The linking unit 112 may identify a need to import the backbone data entry DE11 911 based on a determination that non-backbone data entry DE24 924 is deemed linkable to backbone data entry DE11 911.

The operational example 950 of FIG. 9B depicts, in addition to the data entries DE11-25 911-925 described above in reference to the operational example 900 of FIG. 9A, non-backbone data entry DE26 926 which resides on the second non-backbone staging sub-area 303 of the staging area 122. The non-backbone data entry DE26 926 has resulted from copying the non-backbone data entry DE16 916, which has a link to the previously-copied backbone data entry DE11 911 in the active area 121. Thus, the non-backbone enrichment phase 811 depicted in the operational example 950 of FIG. 9B may be performed immediately following the backbone enrichment phase 812 in order to import non-backbone entries associated with the backbone entries that were in turn imported during the backbone enrichment phase 812. In a subsequent step, the linking unit 112 may proceed to import backbone entries associated with the non-backbone entry DE26 926 in an iterative manner until the staging area 122 reaches a linked state.

FIG. 10 is a flowchart diagram of an example process 1000 for performing cross-data-source linking for a selected data entry based on whether the selected data entry is a backbone data entry or a non-backbone data entry. Via the various steps/operations of process 1000, a system of one or more computers (e.g., the data warehouse system 101 of FIG. 1) can perform cross-data-source linking of data from multiple data sources by utilizing the active area 121 and the staging area 122 until the staging area 122 is determined to be in a linked state. The process 1000 will now be described with reference to the data warehouse system 101 of FIG. 1.

The process 1000 begins at block 1001 when the linking unit 112 determines whether the selected data entry is a backbone data entry or a non-backbone data entry. In some embodiments, the linking unit 112 determines a data source associated with the selected data entry and determines whether the selected data entry is a backbone data entry or a non-backbone data entry based on whether the data source associated with the selected data entry is a backbone data source or a non-backbone data source respectively. If the linking unit 112 determines that the selected data entry is a backbone data entry, the linking unit 112 first enriches one or more new non-backbone data tables in the staging area 122 by copying non-backbone data entries linkable with the selected data entry (at block 1002) and then enriches a backbone data table in the staging area 122 by copying backbone data entries linkable with each non-backbone data entry in the new non-backbone data tables (at block 1003). If the linking unit determines that the selected data entry is a non-backbone data entry, the linking unit 112 enriches a backbone data table in the staging area 122 by copying backbone data entries linkable with the selected data entry (at block 1003).

At block 1004, the linking unit 112 determines whether the enrichments of the prior blocks have increased the number of entries in the new backbone data table (i.e., whether new backbone data entries have been imported to the staging area 122 during the enrichments). If the linking unit 112 determines the enrichments of the prior blocks have increased the number of entries in the new backbone data table, the linking unit 112 repeats the enrichments until an iteration in which the number of entries in the new backbone data table does not increase. On the other hand, if the linking unit 112 determines the enrichments of the prior blocks have not increased the number of entries in the new backbone data table, the linking unit 112 terminates the cross-data-source linking for the selected data entry at block 1005.

FIG. 14 is a flowchart diagram of an example process 1400 for performing cross-data-source linking for a selected data entry based on whether the selected data entry is a backbone data entry, a non-backbone data entry, or a correction non-backbone data entry. Via the various steps/operations of process 1400, a system of one or more computers (e.g., the data warehouse system 101 of FIG. 1) can perform cross-data-source linking of data from multiple data sources by utilizing the active area 121 and the staging area 122 until the staging area 122 is determined to be in a linked state. The process 1400 will now be described with reference to the data warehouse system 101 of FIG. 1.

The process 1400 begins at step/operation 1401 when the linking unit 112 determines whether the selected data entry is a backbone data entry, a non-backbone data entry, or a correction non-backbone data entry. A correction non-backbone data entry is a non-backbone data entry that corrects another data entry, e.g., another backbone data entry or another non-backbone data entry. A primary purpose of differential treatment of correction non-backbone data entries may be to enable comments or corrections to be made by individuals or other programs that manage the integrity of the data while preserving the original record for tracking and history purposes. In some embodiments, the linking unit 112 may enable existing data, represented either in a backbone or a non-backbone entry, to be corrected by an end user and stored as a separate data source and/or entry.

If the linking unit 112 determines that the selected data entry is a backbone data entry, the linking unit 112 first enriches one or more new non-backbone data tables in the staging area 122 by copying non-backbone data entries linkable with the selected data entry (at block 1402) and then enriches a backbone data table in the staging area 122 by copying backbone data entries linkable with each non-backbone data entry in the new non-backbone data tables (at block 1403). If the linking unit determines that the selected data entry is a non-backbone data entry, the linking unit 112 enriches a backbone data table in the staging area 122 by copying backbone data entries linkable with the selected data entry (at block 1403).

At block 1404, the linking unit 112 determines whether the enrichments of the prior blocks have increased the number of entries in the new backbone data table (i.e., whether new backbone data entries have been imported to the staging area 122 during the enrichments). If the linking unit 112 determines the enrichments of the prior blocks have increased the number of entries in the new backbone data table, the linking unit 112 repeats the enrichments until an iteration in which the number of entries in the new backbone data table does not increase. On the other hand, if the linking unit 112 determines the enrichments of the prior blocks have not increased the number of entries in the new backbone data table, the linking unit 112 terminates the cross-data-source linking for the selected data entry at block 1408 as the linking unit 112 determines that the staging memory area is now deemed in a linked state and no further operations are necessary.

If the linking unit 112 determines that the selected data entry is a correction non-backbone data entry, the linking unit 112 first identifies (at block 1405) the backbone source data entry for the correction non-backbone data entry, where the backbone source data entry is a backbone data entry that is either being corrected by the correction non-backbone data entry or that is linked to by a non-backbone data entry that is being corrected by the correction non-backbone data entry (where the link between the non-backbone entry that is being corrected by the correction non-backbone data entry and the backbone source data entry may be immediately identifiable and/or immediately retrievable). Afterward, the linking unit 112 enriches (at block 1406) the staging memory area with the identified backbone data source entry and all of the non-backbone data source entries linked to it. Moreover, the linking unit 112 updates (at block 1407) the linked state of the staging memory area by copying (e.g., instead of re-establishing) the link metadata for the backbone data source entry and updating the link metadata with the link to the correction non-backbone data source entry. Thus, in some embodiments, performing blocks 1406-1407 comprises enriching new backbone data tables in the staging memory area with backbone data entries linked to the correction non-backbone data entries and new non-backbone data tables by copying non-backbone data linked to the correction non-backbone data entries as determined by pre-existing linking. Finally, at block 1408, the linking unit 112 terminates the cross-data-source linking for the selected data entry as the staging memory area is now deemed in a linked state and no further operations are necessary.

Additional Example Implementation Details

Although example processing systems have been described in FIGS. 1 and 11-13, implementations of the subject matter and the functional operations described herein can be implemented in other types of digital electronic circuitry, or in computer software, firmware, or hardware, including the structures disclosed in this specification and their structural equivalents, or in combinations of one or more of them.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs (i.e., one or more modules of computer program instructions) encoded on computer-readable storage medium for execution by, or to control the operation of, information/data processing apparatus. Alternatively, or in addition, the program instructions can be encoded on an artificially-generated propagated command (e.g., a machine-generated electrical, optical, or electromagnetic command) which is generated to encode information/data for transmission to suitable receiver apparatus for execution by an information/data processing apparatus. A computer-readable storage medium can be, or be included in, a computer-readable storage device, a computer-readable storage substrate, a random or serial access memory array or device, or a combination of one or more of them. Moreover, while a computer-readable storage medium is not a propagated command, a computer-readable storage medium can be a source or destination of computer program instructions encoded in an artificially-generated propagated command. The computer-readable storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry (e.g., an FPGA (field programmable gate array) or an ASIC (Application Specific Integrated Circuit)). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or information/data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory, a random access memory, or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data (e.g., magnetic, magneto-optical disks, or optical disks). However, a computer need not have such devices. Devices suitable for storing computer program instructions and information/data include all forms of non-volatile memory, media and memory devices, including by way of example semiconductor memory devices (e.g., EPROM, EEPROM, and flash memory devices; magnetic disks, such as internal hard disks or removable disks; magneto-optical disks; and CD-ROM and DVD-ROM disks). The processor and the memory can be supplemented by, or incorporated in, special purpose logic circuitry.

To provide for interaction with a user, embodiments of the subject matter described herein can be implemented on a computer having a display device (e.g., a CRT (cathode ray tube) or LCD (liquid crystal display) monitor) for displaying information/data to the user and a keyboard and a pointing device (e.g., a mouse or a trackball, by which the user can provide input to the computer). Other kinds of devices can be used to provide for interaction with a user as well; for example, feedback provided to the user can be any form of sensory feedback (e.g., visual feedback, auditory feedback, or tactile feedback; and input from the user can be received in any form, including acoustic, speech, or tactile input). In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a back-end component (e.g., as an information/data server), or that includes a middleware component (e.g., an application server), or that includes a front-end component (e.g., a client device having a graphical user interface or a web browser through which a user can interact with an implementation of the subject matter described herein), or any combination of one or more such back-end, middleware, or front-end components. The components of the system can be interconnected by any form or medium of digital information/data communication (e.g., a communication network). Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits information/data (e.g., an HTML page) to a client device (e.g., for purposes of displaying information/data to and receiving user input from a user interacting with the client device). Information/data generated at the client device (e.g., a result of the user interaction) can be received from the client device at the server.

While this specification contains many specific implementation details, these should not be construed as limitations on the scope of any disclosures or of what may be claimed, but rather as description of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results, unless described otherwise. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results, unless described otherwise. In certain implementations, multitasking and parallel processing may be advantageous.

Many modifications and other embodiments of the disclosures set forth herein will come to mind to one skilled in the art to which these disclosures pertain having the benefit of the teachings presented in the foregoing description and the associated drawings. Therefore, it is to be understood that the disclosures are not to be limited to the specific embodiments disclosed and that modifications and other embodiments are intended to be included within the scope of the appended claims. Although specific terms are employed herein, they are used in a generic and descriptive sense only and not for purposes of limitation, unless described otherwise.

That which is claimed:

1. A computer-implemented method for linking multiple data entries each associated with a data source of a plurality of data sources, comprising:
   storing one or more unlinked data entries of the multiple data entries in a staging memory area and a plurality of linked data entries of the multiple data entries in an active memory area,
   repeatedly performing a current iteration of one or more cross-data-source linking operations until a linked state status for the staging memory area indicates a linked state;
   linking the multiple data entries by merging the staging memory area and the active memory area to generate linked data; and
   generating, in real-time, one or more cross-data-source reports and causing display of the one or more cross-data-source reports based on the linked data, the one or more cross-data-source reports comprising a data analysis of at least two of the multiple data entries each associated with a different data source.

2. The computer-implemented method of claim 1, wherein:
   each data source of the plurality of data sources is either a backbone data source or a non-backbone data source; and
   the computer-implemented method further comprises determining, for each data entry of the multiple data entries, whether the data entry is either a backbone data entry or a non-backbone data entry based on whether the data source associated with the data entry is a backbone data source or a non-backbone data source.

3. The computer-implemented method of claim 1, wherein the plurality of data sources comprise a backbone data source and one or more non-backbone data sources.

4. The computer-implemented method of claim 1, wherein the plurality of data sources comprise a plurality of backbone data sources and a plurality of non-backbone data sources.

5. The computer-implemented method of claim 1, wherein:
   the linking of the multiple data entries is performed in accordance with one or more linking conditions;
   the one or more linking conditions permit links from a non-backbone data entry to a backbone data entry; and
   the one or more linking conditions do not permit links from a backbone data entry to a non-backbone data entry.

6. The computer-implemented method of claim 1, wherein the one or more cross-data-source linking operations comprise:
   for each first data entry in the staging memory area that is a backbone data entry and that is linking-eligible, importing into the staging memory area any data entry in the active memory area that is a non-backbone data entry deemed linkable to the first data entry and subsequently marking the first data entry as linking-ineligible;
   for each second data entry in the staging memory area that is a non-backbone data entry and that is linking-eligible, importing into the staging memory area any data entry in the active memory area that is a backbone data entry deemed linkable to the second data entry and subsequently marking the second data entry as linking-ineligible; and
   updating the linked state status based on whether the current iteration caused importing of any backbone data entries into the staging memory area.

7. The computer-implemented method of claim 6, wherein importing a third data entry in the active memory area that is a non-backbone data entry deemed linkable to the first data entry comprises:
   determining whether the third data entry is time-sensitive or non-time-sensitive;
   in response to determining that the third data entry is time-sensitive, importing the third time entry into the active memory area with a new entry identifier and marking the third time entry as update-eligible; and
   in response to determining that the third data entry is non-time-sensitive, importing the third time entry into the active memory area without a new entry identifier and marking the third time entry as update-ineligible.

8. The computer-implemented method of claim 1, wherein merging the staging memory area and the active memory area comprises:
   identifying a merging memory area;
   storing the staging memory area and the active memory area into the merging memory area; and
   designating the merging memory area as the active memory area.

9. The computer-implemented method of claim 1, further comprising:
   identifying the linked state status for the staging memory area, the linked state status initially indicating a non-linked state.

10. The computer-implemented method of claim 1, wherein the one or more cross-data source reports comprise at least one of a pre-flight report, an in-flight report, and a post-flight report.

11. The computer-implemented method of claim 10, wherein the in flight report comprises one or more of a real-time flight statistics report or a real-time fuel efficiency report.

12. The computer-implemented method of claim 1, wherein the one or more cross-data-source linking operations comprise:
   for each first data entry in the staging memory area that is a correction non-backbone data entry and that is linking-eligible, importing into the staging memory area any backbone data entry in the active memory area that is linked to the first data entry and any non-backbone data entry in the active memory area that is linked to the first data entry and subsequently marking the first data entry as linking-ineligible.

13. An apparatus comprising at least one processor and at least one non-transitory memory comprising program code, wherein the at least one non-transitory memory and the program code are con-figured to, with the at least one processor, cause the apparatus to at least perform a method for linking multiple data entries each associated with a data source of a plurality of data sources, wherein the method comprises:
   storing one or more unlinked data entries of the multiple data entries in a staging memory area and a plurality of linked data entries of the multiple data entries in an active memory area, repeatedly performing a current iteration of one or more cross-data-source linking operations until a linked state status for the staging memory area indicates a linked state;

linking the multiple data entries by merging the staging memory area and the active memory area to generate linked data; and generating, in real-time, one or more cross-data-source reports and causing display of the one or more cross-data-source reports based on the linked data, the one or more cross-data-source reports comprising a data analysis of at least two of the multiple data entries each associated with a different data source.

14. The apparatus of claim 13, wherein:
each data source of the plurality of data sources is either a backbone data source or a non-backbone data source; and
the computer-implemented method further comprises determining, for each data entry of the multiple data entries, whether the data entry is either a backbone data entry or a non-backbone data entry based on whether the data source associated with the data entry is a backbone data source or a non-backbone data source.

15. The apparatus of claim 13, wherein the plurality of data sources comprise a backbone data source and one or more non-backbone data sources.

16. The apparatus of claim 13, wherein the plurality of data sources comprise a plurality of backbone data sources and a plurality of non-backbone data sources.

17. The apparatus of claim 13, wherein:
the linking of the multiple data entries is performed in accordance with one or more linking conditions;
the one or more linking conditions permit links from a non-backbone data entry to a backbone data entry; and
the one or more linking conditions do not permit links from a backbone data entry to a non-backbone data entry.

18. The apparatus of claim 13, wherein the one or more cross-data-source linking operations comprise:
for each first data entry in the staging memory area that is a backbone data entry and that is linking-eligible, importing into the staging memory area any data entry in the active memory area that is a non-backbone data entry deemed linkable to the first data entry and subsequently marking the first data entry as linking-ineligible;

for each second data entry in the staging memory area that is a non-backbone data entry and that is linking-eligible, importing into the staging memory area any data entry in the active memory area that is a backbone data entry deemed linkable to the second data entry and subsequently marking the second data entry as linking-ineligible; and updating the linked state status based on whether the current iteration caused importing of any backbone data entries into the staging memory area.

19. The apparatus of claim 18, wherein importing a third data entry in the active memory area that is a non-backbone data entry deemed linkable to the first data entry comprises:
determining whether the third data entry is time-sensitive or non-time-sensitive;
in response to determining that the third data entry is time-sensitive, importing the third time entry into the active memory area with a new entry identifier and marking the third time entry as update-eligible; and
in response to determining that the third data entry is non-time-sensitive, importing the third time entry into the active memory area without a new entry identifier and marking the third time entry as update-ineligible.

20. A non-transitory computer storage medium comprising instructions configured to cause one or more processors to at least perform a method for linking multiple data entries each associated with a data source of a plurality of data sources, wherein the method comprises:
storing one or more unlinked data entries of the multiple data entries in a staging memory area and a plurality of linked data entries of the multiple data entries in an active memory area;
repeatedly performing a current iteration of one or more cross-data-source linking operations until a linked state status for the staging memory area indicates a linked state;
linking the multiple data entries by merging the staging memory area and the active memory area to generate linked data; and
generating, in real-time, one or more cross-data-source reports and causing display of the one or more cross-data-source reports based on the linked data, the one or more cross-data-source reports comprising a data analysis of at least two of the multiple data entries each associated with a different data source.

\* \* \* \* \*